(12) United States Patent
Kanagawa et al.

(10) Patent No.: US 12,525,465 B2
(45) Date of Patent: Jan. 13, 2026

(54) SUBSTRATE PROCESSING SYSTEM AND SUBSTRATE PROCESSING METHOD

(71) Applicant: TOKYO ELECTRON LIMITED, Tokyo (JP)

(72) Inventors: Kouzou Kanagawa, Koshi (JP); Kotaro Tsurusaki, Koshi (JP); Keiji Onzuka, Koshi (JP); Yoshihiro Kai, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/619,636

(22) Filed: Mar. 28, 2024

(65) Prior Publication Data

US 2024/0242975 A1    Jul. 18, 2024

Related U.S. Application Data

(60) Continuation of application No. 17/886,687, filed on Aug. 12, 2022, now Pat. No. 11,978,644, which is a
(Continued)

(30) Foreign Application Priority Data

Oct. 10, 2019    (JP) ................................. 2019-187084

(51) Int. Cl.
*H01L 21/56* (2006.01)
*H01L 21/02* (2006.01)

(52) U.S. Cl.
CPC ...... *H01L 21/561* (2013.01); *H01L 21/02101* (2013.01)

(58) Field of Classification Search
CPC ............ H01L 21/561; H01L 21/02101; H01L 21/02057; H01L 21/67028;
(Continued)

(56) References Cited

U.S. PATENT DOCUMENTS 5,844,662 A * 12/1998 Akimoto ............. G03F 7/70875
396/611
8,033,288 B2 * 10/2011 Shiomi ............. H01L 21/67781
414/222.01
(Continued)

FOREIGN PATENT DOCUMENTS

CN    1828828 A  *  9/2006 ....... H01L 21/67781
CN    1864250 A  * 11/2006 ....... H01L 21/02057
(Continued)

*Primary Examiner* — Mohammed Shamsuzzaman
(74) *Attorney, Agent, or Firm* — Nath, Goldberg & Meyer; Jerald L. Meyer; Tanya E. Harkins

(57) ABSTRACT

A substrate processing system includes: a batch-type processing part that collectively processes a lot including substrates arranged at a first pitch; a single-substrate-type processing part that processes the substrates of the lot one by one; and an interface part that delivers the substrates between the batch-type processing part and the single-substrate-type processing part. The batch-type processing part includes a processing bath that stores a processing solution having a lump shape or a mist shape, a first holder that holds the substrates arranged at the first pitch, and a second holder that receives the substrates arranged at a second pitch from the first holder in the processing solution. The interface part includes a transfer part that transfers the substrates held separately by the first and second holders in the processing solution, from the batch-type processing part to the single-substrate-type processing part.

7 Claims, 15 Drawing Sheets

Related U.S. Application Data division of application No. 17/063,169, filed on Oct. 5, 2020, now Pat. No. 11,469,114.

(58) Field of Classification Search
CPC ......... H01L 21/67034; H01L 21/67057; H01L 21/67173; H01L 21/67748; H01L 21/67754; H01L 21/67757; H01L 21/67778; H01L 21/67781; H01L 21/67766; H01L 21/67155; H01L 21/0201; H01L 21/6704; H01L 21/67075; H01L 21/67207; H01L 21/67201; H01L 21/673; H01L 21/67742; B08B 3/048; F26B 5/005

See application file for complete search history.

(56) References Cited

U.S. PATENT DOCUMENTS

| | | | | |
|---|---|---|---|---|
| 12,183,613 | B2 * | 12/2024 | Kanagawa | ........ H01L 21/67313 |
| 2002/0011207 | A1 * | 1/2002 | Uzawa | ............. H01L 21/67017 |
| | | | | 118/666 |
| 2002/0076306 | A1 * | 6/2002 | Tateyama | .......... H01L 21/67178 |
| | | | | 414/225.01 |
| 2003/0164179 | A1 * | 9/2003 | Kamikawa | ........ H01L 21/67781 |
| | | | | 134/25.4 |
| 2007/0017442 | A1 * | 1/2007 | Yamasaki | ........... H01L 21/6776 |
| | | | | 118/695 |
| 2008/0216880 | A1 * | 9/2008 | Shiomi | ............. H01L 21/67781 |
| | | | | 134/133 |
| 2011/0103923 | A1 * | 5/2011 | Minamida | ......... H01L 21/67196 |
| | | | | 414/222.01 |
| 2011/0126860 | A1 * | 6/2011 | Hyakutake | ........ H01L 21/67057 |
| | | | | 134/56 R |
| 2013/0230375 | A1 * | 9/2013 | Tung | ................. H01L 21/67733 |
| | | | | 414/592 |
| 2014/0356106 | A1 * | 12/2014 | Kamikawa | ........ H01L 21/67769 |
| | | | | 414/222.13 |
| 2021/0111038 | A1 * | 4/2021 | Kanagawa | ........ H01L 21/67754 |
| 2021/0111054 | A1 * | 4/2021 | Kanagawa | ........ H01L 21/67757 |

FOREIGN PATENT DOCUMENTS

| | | | | | |
|---|---|---|---|---|---|
| CN | 100399533 C | * | 7/2008 | ....... | H01L 21/67173 |
| DE | 19906805 A1 | * | 9/1999 | ....... | H01L 21/67781 |
| GB | 2436165 A | * | 9/2007 | ........... | G02F 1/1303 |
| JP | H9-162157 A | | 6/1997 | | |
| JP | 2000036527 A | | 2/2000 | | |
| JP | 2002057100 A | * | 2/2002 | ....... | H01L 21/67017 |
| JP | 2003007800 A | * | 1/2003 | ......... | C23C 16/4401 |
| JP | 2003203833 A | * | 7/2003 | ....... | H01L 21/67028 |
| JP | 2004-296823 A | | 10/2004 | | |
| JP | 2006147779 A | | 6/2006 | | |
| JP | 2006179757 A | * | 7/2006 | ........... | G03F 7/7075 |
| JP | 2006261546 A | * | 9/2006 | ........... | G03F 7/7075 |
| JP | 2011222633 A | * | 11/2011 | ....... | H01L 21/67781 |
| JP | 2012-146862 A | | 8/2012 | | |
| JP | 2018093066 A | * | 6/2018 | ....... | H01L 21/02052 |
| KR | 1020040082733 A | | 9/2004 | | |
| KR | 20070080771 A | * | 8/2007 | ....... | H01L 21/67017 |
| WO | WO-2006112532 A1 | * | 10/2006 | ............. | B24B 21/16 |

* cited by examiner

SUBSTRATE PROCESSING SYSTEM AND SUBSTRATE PROCESSING METHOD

CROSS-REFERENCE TO RELATED APPLICATION

This application is based upon and claims the benefit of priority from Japanese Patent Application No. 2019-187084, filed on Oct. 10, 2019, the entire contents of which are incorporated herein by reference.

TECHNICAL FIELD

The present disclosure relates to a substrate processing system and a substrate processing method.

BACKGROUND

The drying apparatus disclosed in Patent Document 1 includes a buffer bath, a transfer part, and a rotary drying part. The buffer bath holds a semiconductor wafer, which has been washed with water while immersed. Plural sheets of semiconductor wafers are washed with water in a state of being placed on one holding stage, and are held in the water inside the buffer bath in the state of being placed on the holding stage. The transfer part picks up and transfers the semiconductor wafers one by one from the buffer bath. The rotary drying part supports one sheet of semiconductor wafer transferred by the transfer part such that the main surface thereof is kept horizontal and rotates the semiconductor wafer at a high speed to remove water.

PRIOR ART DOCUMENT

Patent Document

Patent Document 1: Japanese Laid-Open Patent Publication No. H09-162157

SUMMARY

According to one embodiment of the present disclosure, there is provided a substrate processing system including: a batch-type processing part configured to collectively process a lot including a plurality of substrates arranged at a first pitch; a single-substrate-type processing part configured to process the plurality of substrates of the lot one by one; and an interface part configured to deliver the plurality of substrates between the batch-type processing part and the single-substrate-type processing part, wherein the batch-type processing part includes a processing bath that stores a processing solution having a lump shape or a mist shape, a first holder configured to hold the plurality of substrates arranged at the first pitch, and a second holder configured to receive the plurality of substrates arranged at a second pitch, which is N times of the first pitch (N is a natural number of 2 or more), from the first holder in the processing solution, and wherein the interface part includes a transfer part configured to transfer the plurality of substrates, which are held separately by the first holder and the second holder in the processing solution, from the batch-type processing part to the single-substrate-type processing part.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
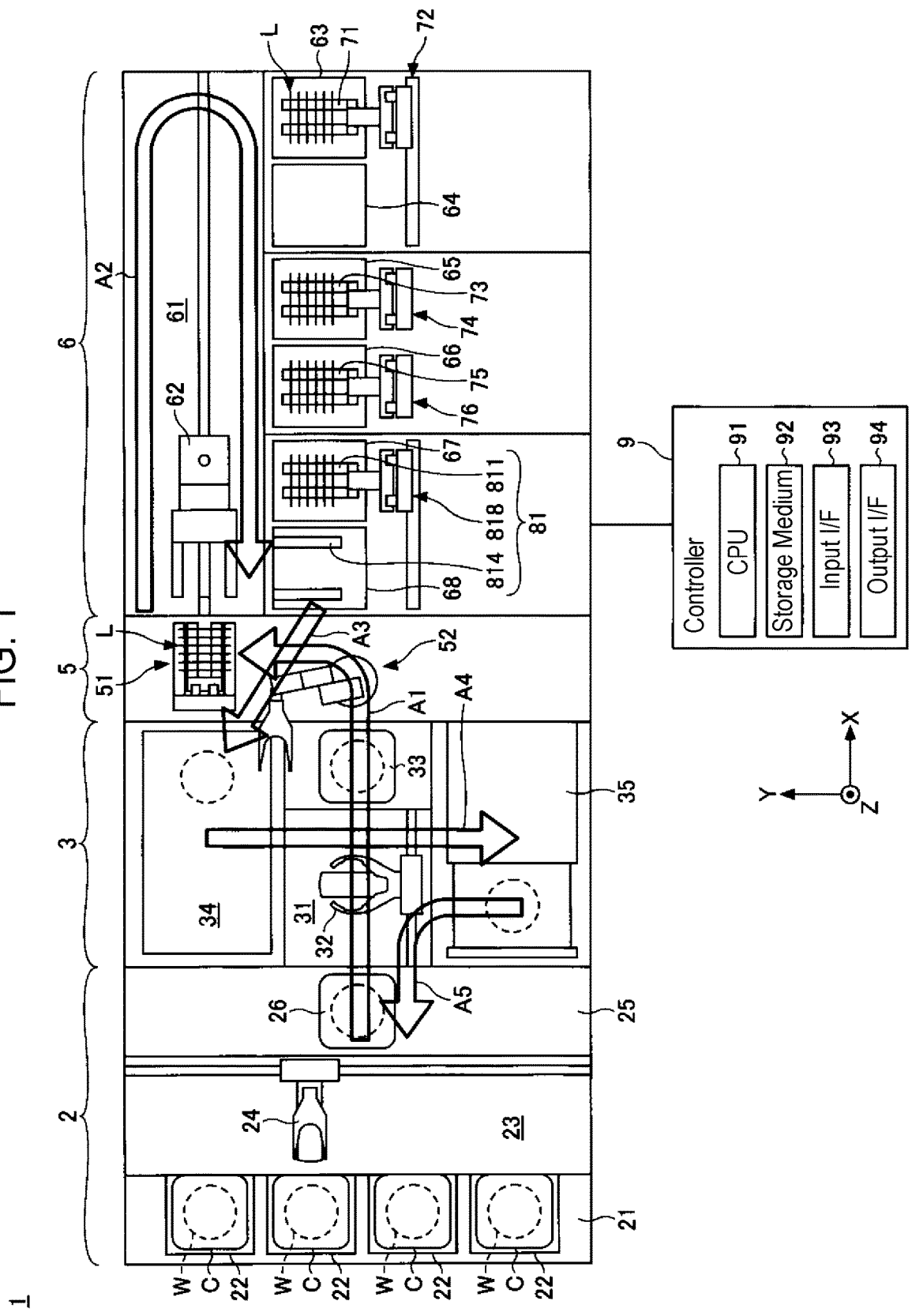
FIG. 1 is a plan view of a substrate processing system according to an embodiment.

Hereinafter, embodiments of the present disclosure will be described with reference to the drawings. In addition, in each drawing, the same or corresponding components will be denoted by the same reference numerals, and a description thereof may be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As illustrated in FIG. 1, a substrate processing system 1 includes a loading/unloading part 2, a single-substrate-type processing part 3, an interface part 5, a batch-type processing part 6, and a controller 9. The loading/unloading part 2 has a stage 21 on which cassettes C are placed. Each cassette C accommodates plural sheets (e.g., 25) of substrates W and is loaded into and unloaded from the loading/unloading part 2. Inside the cassette C, the substrates W are held in a horizontal posture and are held in a vertical direction at a second pitch P2 (P2=N×P1), which is N times a first pitch P1. N is a natural number of 2 or more. N is 2 in the present embodiment, and may be 3 or more. The single-substrate-type processing part 3 processes the substrates W one by one. The interface part 5 delivers the substrates W between the single-substrate-type processing part 3 and the batch-type processing part 6. The batch-type processing part 6 collectively processes a lot L including the plural sheets (e.g., 50) of substrates W corresponding to the first pitch P1. One lot L is composed of, for example, the substrates W of N cassettes C.

The loading/unloading part 2, the single-substrate-type processing part 3, the interface part 5, and the batch-type processing part 6 are arranged in this order from the negative side in the X-axis direction to the positive side in the X-axis direction. Each substrate W is transferred from the loading/unloading part 2 in the order of arrows A1, A2, A3, A4, and A5 indicated in FIG. 1, and is returned to the loading/unloading part 2. The loading/unloading part 2 serves as both a loading part and an unloading part. It is therefore possible to downsize the substrate processing system 1.

The loading/unloading part 2 has the stage 21. The stage 21 has a plurality of placement boards 22. The plurality of cassettes C are placed on the plurality of placement boards 22, respectively. The number of placement boards 22 is not particularly limited. Likewise, the number of cassettes C is not particularly limited.

The loading/unloading part 2 has a first transfer region 23, which is adjacent to the stage 21, and is arranged on the positive side of the stage 21 in the X-axis direction. A first transfer device 24 is provided in the first transfer region 23. The first transfer device 24 has a first transfer arm. The first transfer arm is able to move in the horizontal direction (the X-axis direction and the Y-axis direction) and the vertical direction, and is rotatable around the vertical axis. The first transfer arm transfers the substrate W between the cassette C and a delivery part 25 described later. The number of first transfer arms may be one or more. In the latter case, the first transfer device 24 collectively transfers plural sheets (e.g., 5) of substrates W.

The loading/unloading part 2 has the delivery part 25. The delivery part 25 is located adjacent to the first transfer region 23 and is arranged on the positive side of the first transfer region 23 in the X axis direction. The delivery part 25 includes a first transition device 26 that temporarily stores the substrate W. A single or multiple first transition devices 26 may be provided. The plurality of first transition devices 26 may be stacked in the vertical direction. The first transition device 26 receives the substrate W from the first transfer device 24 and temporarily stores the substrate W until the substrate W is delivered to a second transfer device 32 described later. The first transition device 26 receives the substrate W from the second transfer device 32 and temporarily stores the substrate W until the substrate W is delivered to the first transfer device 24.

The single-substrate-type processing part 3 has a second transfer region 31, which is adjacent to the delivery part 25, and is arranged on the positive side of the delivery part 25 in the X-axis direction. The second transfer device 32 is provided in the second transfer region 31. The second transfer device 32 has a second transfer arm. The second transfer arm is movable in the horizontal direction (the X-axis direction and the Y-axis direction) and the vertical direction, and is rotatable around the vertical axis. The second transfer arm transfers the substrate between apparatuses adjacent to the second transfer region 31. The number of second transfer arms may be one or more. In the latter case, the second transfer device 32 collectively transfers plural sheets (e.g., 5) of substrates W.

The single-substrate-type processing part 3 includes, for example, a second transition device 33, a solution processing apparatus 34, and a drying apparatus 35, which are adjacent to the second transfer region 31. The second transition device 33 is located adjacent to the second transfer region 31, and is arranged on the positive side of the second transfer region 31 in the X axis direction. The second transition device 33 receives the substrate W from the second transfer device 32 and temporarily stores the substrate W until the substrate W is delivered to the interface part 5. The solution processing apparatus 34 is of a single substrate type and processes the substrates W one by one with a processing solution. The processing solution may be provided in plural numbers. For example, pure water, such as deionized water (DIW), or a drying solution having a surface tension lower than that of the pure water, may be used as the processing solution. The drying solution may be an alcohol such as IPA (isopropyl alcohol). The drying apparatus 35 is of a single substrate type and dries the substrates W one by one with a supercritical fluid. Both the solution processing apparatus 34 and the drying apparatus 35 may not be of a single substrate type. The solution processing apparatus 34 may be of a single substrate type, and the drying apparatus 35 may be of a batch type. The drying apparatus 35 may dry the plurality of substrates W collectively with the supercritical fluid. The number of substrates W collectively processed by the drying apparatus 35 may be equal to or more than the number of substrates W collectively processed by the batch-type processing part 6. However, the former may be smaller than the latter.

The arrangement and number of solution processing apparatuses 34 and drying apparatuses 35 are not limited to those illustrated in FIG. 1. For example, the solution processing apparatuses 34 may be arranged on both sides of the second transfer region 31 in the Y-axis direction. Further, the solution processing apparatuses 34 may be stacked in the Z-axis direction. The arrangement of the drying apparatuses 35 is the same as the arrangement of the solution processing apparatuses 34. Further, apparatuses other than the solution processing apparatus 34 and the drying apparatus 35 may be arranged in the vicinity of the second transfer region 31.

The interface part 5 has, for example, a lot formation part 51 and a transfer part 52. The lot formation part 51 holds the plurality of substrates W at the first pitch P1 and forms a lot L. The transfer part 52 transfers the substrates W from the single-substrate-type processing part 3 to the lot formation part 51, and also transfers the substrates W from the batch-type processing part 6 to the single-substrate-type processing part 3.

Figure 7:
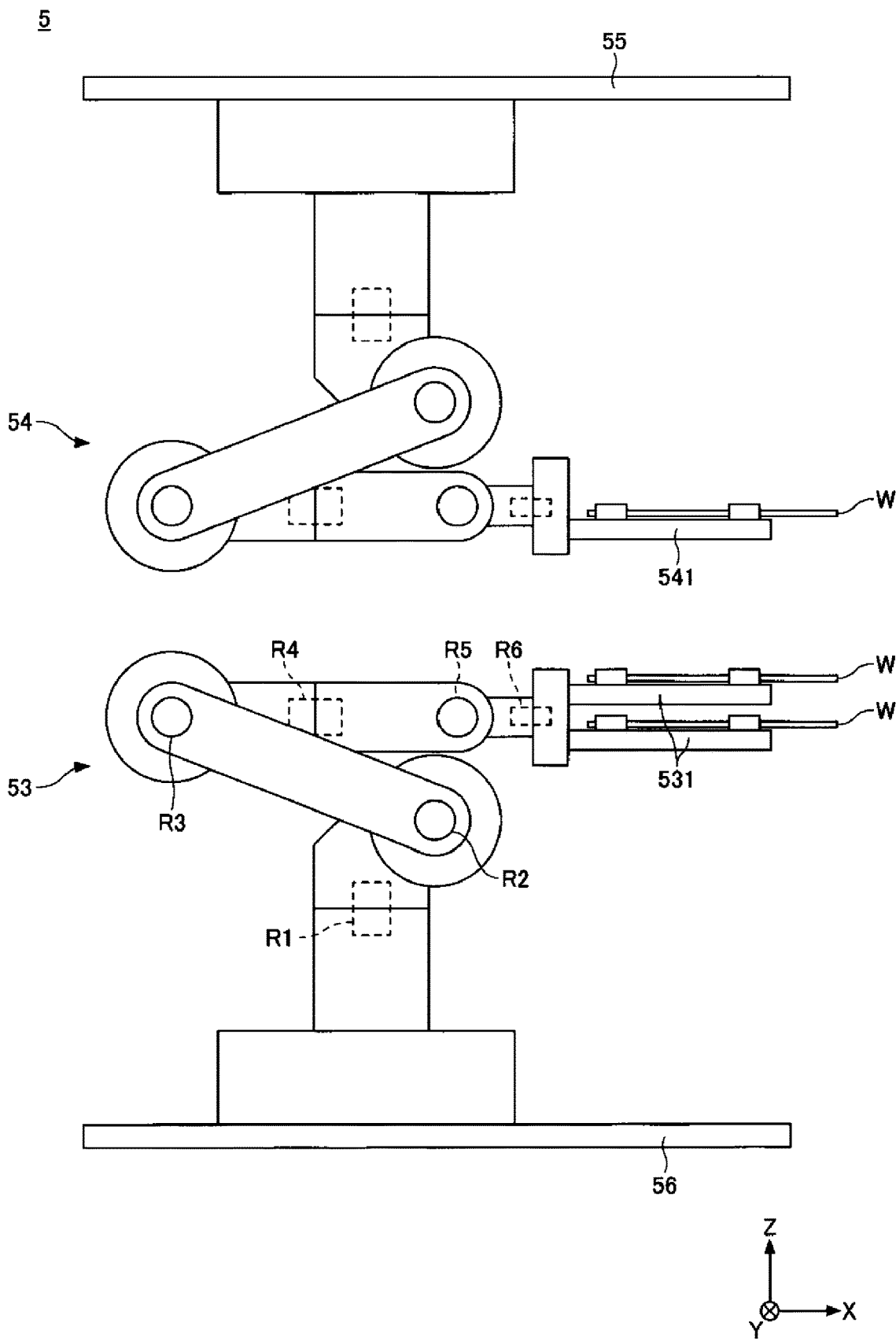
FIG. 7 is a side view illustrating an example of a transfer part of an interface part in FIG. 1.
Figure 8:
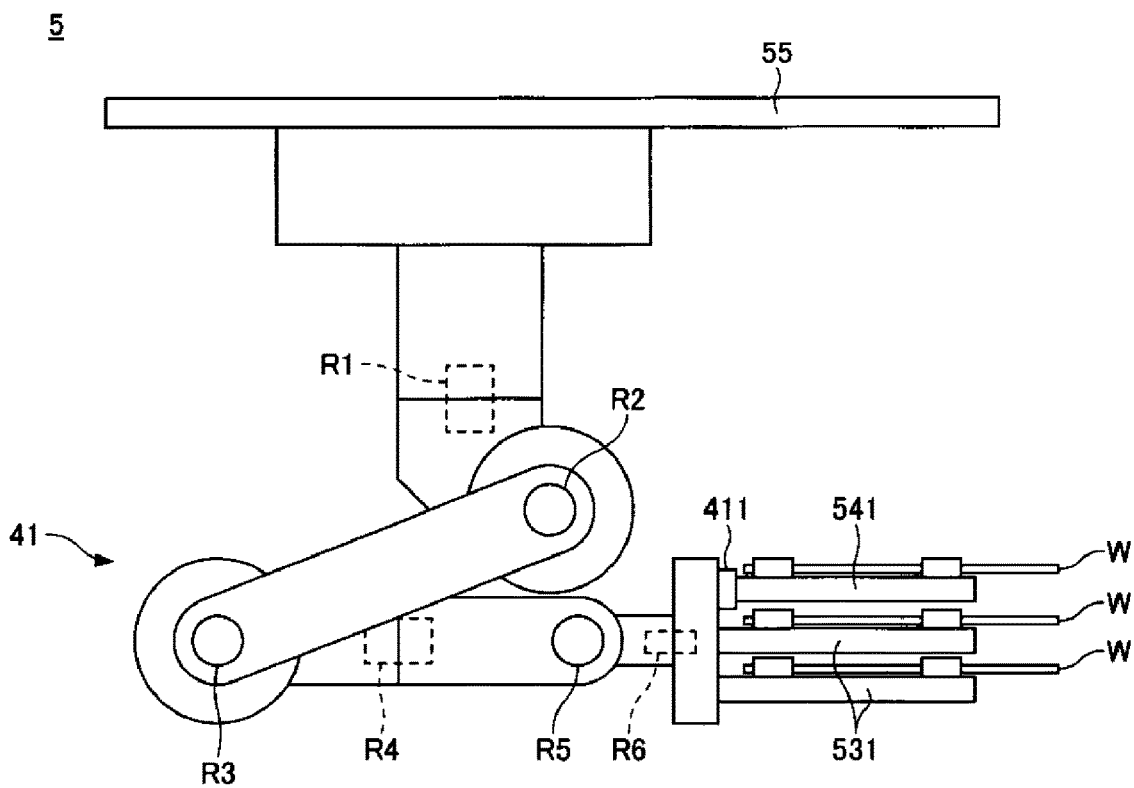
FIG. 8 is a side view illustrating another example of the transfer part.

As illustrated in FIG. 7, the transfer part 52 includes a first transfer robot 53 and a second transfer robot 54. The first transfer robot 53 transfers the substrates W from the single-substrate-type processing part 3 to the lot formation part 51. The second transfer robot 54 transfers the substrates W from the batch-type processing part 6 to the single-substrate-type processing part 3. As illustrated in FIG. 8, the transfer part 52 may include a single transfer robot 41, which also serves as both the first transfer robot 53 and the second transfer robot 54.

Since the first transfer robot 53 and the second transfer robot 54 are provided separately, a flow A1 of the substrates W from the single-substrate-type processing part 3 to the batch-type processing part 6 and a flow A3 of the substrates W from the batch-type processing part 6 to the single-substrate-type processing part 3 may be controlled independently of each other. Therefore, it is possible to suppress the stagnation of the flow of the substrates W in the interface part 5 and to improve the throughput.

The batch-type processing part 6 has a third transfer region 61, which is adjacent to the interface part 5, and is arranged on the positive side of the interface part 5 in the X-axis direction. A third transfer device 62 is provided in the third transfer region 61. The third transfer device 62 has a third transfer arm. The third transfer arm is movable in the horizontal direction (the X-axis direction and the Y-axis direction) and the vertical direction, and is rotatable around the vertical axis. Alternatively, the third transfer arm may not rotate around the vertical axis. The third transfer arm transfers the substrates W between apparatuses adjacent to the third transfer region 61. The third transfer arm transfers the lots L in a collective manner.

The third transfer region 61 has a rectangular shape in a plan view. A longitudinal direction of the rectangular shape corresponds to the X-axis direction. The lot formation part 51 is arranged near the short side of the third transfer region 61, and a processing bath (e.g., a third rinse solution bath 68) is arranged near the long side of the third transfer region 61. The transfer parts 52 are arranged near both the lot formation part 51 and the processing bath. Since the transfer part 52 is capable of easily accessing both the lot formation part 51 and the processing bath, it is possible to use, among the first transfer robot 53 and the second transfer robot 54, one having a shorter accessible range.

Since the lot formation part 51 is arranged near the short side of the third transfer region 61 and the processing bath is arranged near the long side of the third transfer region 61, the arrangement direction of the substrates W in the lot formation part 51 and the processing bath are different from each other. Therefore, the third transfer device 62 rotates around the vertical axis. With the rotation of the third transfer device 62, the arrangement direction of the substrates W may be changed between the X-axis direction and the Y-axis direction. When it is not necessary to change the arrangement direction of the substrates, the rotation of the third transfer device 62 in the vertical direction may be omitted.

The batch-type processing part 6 includes, for example, a first chemical solution bath 63, a first rinse solution bath 64, a second chemical solution bath 65, a second rinse solution bath 66, a third chemical solution bath 67, and a third chemical solution 68, which is arranged near the third transfer region 61. These processing baths are arranged along the long side of the third transfer region 61. Specifically, the first chemical solution bath 63, the first rinse solution bath 64, the second chemical solution bath 65, the second rinse solution bath 66, the third chemical solution bath 67, and the third rinse solution bath 68 are arranged in this order from the positive side in the X-axis direction toward the negative side in the X-axis direction.

The number of processing baths arranged near the third transfer region 61 is not limited to that illustrated in FIG. 1. For example, the second chemical solution bath 65 and the second rinse solution bath 66 constitutes one set in FIG. 1, but may be provided in a plurality of sets.

The first chemical solution bath 63 stores a first chemical solution in which the lot L is immersed. The first chemical solution is not particularly limited, but may be, for example, dilute hydrofluoric acid (DHF). The DHF removes a natural oxide film. BHF (a mixed solution of hydrofluoric acid and ammonium fluoride) may be used instead of the DHF. The first rinse solution bath 64 stores a first rinse solution in which the lot L is immersed. The first rinse solution is pure water that removes the first chemical solution from the substrates W and may be, for example, deionized water (DIW).

The batch-type processing part 6 has a first processing tool 71 that receives the lot L from the third transfer device 62 and holds the lot L. The first processing tool 71 holds the plurality of substrates W at the first pitch P1 in the Y-axis direction, and holds each of the plurality of substrates W vertically. The batch-type processing part 6 further includes a first driving device 72 that moves the first processing tool 71 in the X-axis direction and the Z-axis direction. The first processing tool 71 holds the lot L in the first chemical solution, then holds the lot L in the first rinse solution, and then delivers the lot L to the third transfer device 62.

The number of units of the first processing tool 71 and the first driving device 72 is one in the present embodiment, but may be two or more. In the latter case, one unit may immerse the lot L in the first chemical solution, and the other unit may immerse the lot L in the first rinse solution. In this case, the first driving device 72 may move the first processing tool 71 in the Z-axis direction, and may not move the first processing tool 71 in the X-axis direction.

The second chemical solution bath 65 stores a second chemical solution in which the lot L is immersed. The second chemical solution is not particularly limited, but may be, for example, a phosphoric acid aqueous solution. The phosphoric acid aqueous solution selectively etches away, among a silicon oxide film and a silicon nitride film, the silicon nitride film. The second rinse solution bath 66 stores a second rinse solution in which the lot L is immersed. The second rinse solution is pure water that removes the second chemical solution from the substrates W and may be, for example, deionized water (DIW).

The batch-type processing part 6 has a second processing tool 73 that receives the lot L from the third transfer device 62 and holds the lot L. Like the first processing tool 71, the second processing tool 73 holds the plurality of substrates W at the first pitch P1 in the Y-axis direction and vertically holds each of the plurality of substrates W. The batch-type processing part 6 further includes a second driving device 74 that moves the second processing tool 73 in the Z-axis direction. The second processing tool 73 holds the lot L in the second chemical solution, and then delivers the lot L to the third transfer device 62.

Likewise, the batch-type processing part 6 has a third processing tool 75 that receives the lot L from the third transfer device 62 and holds the lot L. Like the first processing tool 71, the third processing tool 75 holds the plurality of substrates W at the first pitch P1 in the Y-axis direction and vertically holds each of the plurality of substrates W. The batch-type processing part 6 further includes a third driving device 76 that moves the third processing tool 75 in the Z-axis direction. The third processing tool 75 holds the lot L in the second rinse solution, and then delivers the lot L to the third transfer device 62.

The third chemical solution bath 67 stores a third chemical solution in which the lot L is immersed. The third chemical solution is not particularly limited, but may be, for example, SC1 (a mixed solution of ammonia, hydrogen peroxide, and water). The SC1 removes organic substances and particles. The third rinse solution bath 68 stores a third rinse solution in which the lot L is immersed. The third rinse solution is pure water that removes the third chemical solution from the substrates W and may be, for example, deionized water (DIW).

The batch-type processing part 6 has a first holder 811 that receives the lot L from the third transfer device 62 and holds the lot L. The first holder 811 holds the plurality of substrates W at the first pitch P1 in the Y-axis direction, and vertically holds each of the plurality of substrates W. The batch-type processing part 6 further includes a driving device 818 that moves the first holder 811 in the X-axis direction and the Z-axis direction. The first holder 811 holds the lot L in the third chemical solution, and then holds the lot L in the third rinse solution.

The number of units of the first holder 811 and the first driving device 818 is one in the present embodiment, but may be two or more. In the latter case, one unit may immerse the lot L in the third chemical solution, and the other unit may immerse the lot L in the third rinse solution. In this case, the driving device 818 may move the first holder 811 in the Z-axis direction, but may not move the first holder 811 in the X-axis direction.

In addition, the batch-type processing part 6 has a second holder 814 that receives the plurality of substrates W arranged at the second pitch P2 (P2=N×P1) from the first holder 811 in the third processing solution. A combination of the first holder 811, the second holder 814, and the driving device 818 constitutes a lot release part 81.

The types of chemical solutions used in the batch-type processing part 6 are not limited to the dilute hydrofluoric acid, the BFH, the phosphoric acid aqueous solution, and the SC1, and may be, for example, dilute sulfuric acid, SPM (mixed solution of sulfuric acid, hydrogen peroxide, and water), SC2 (mixed solution of hydrochloric acid, hydrogen peroxide, and water), TMAH (mixed solution of tetramethylammonium hydroxide and water), a plating solution or the like. The chemical solutions may be for peeling or plating. Further, the number of chemical solutions is not particularly limited, and may be one.

The controller 9 is, for example, a computer, and includes a central processing unit (CPU) 91 and a storage medium 92 such as memory. The storage medium 92 stores programs that control various processes executed in the substrate processing system 1. The controller 9 controls the operation of the substrate processing system 1 by causing the CPU 91 to execute the program stored in the storage medium 92. Further, the controller 9 includes an input interface 93 and an output interface 94. The controller 9 receives a signal from the outside using the input interface 93 and transmits a signal to the outside using the output interface 94.

The programs described above are stored in, for example, a non-transitory computer-readable storage medium, and is installed on the storage medium 92 of the controller 9 from the storage medium. The computer-readable storage medium may be, for example, a hard disc (HD), a flexible disc (FD), a compact disc (CD), a magneto-optical disc (MO), a memory card, or the like. The program may be downloaded from a server via the Internet and may be installed on the storage medium 92 of the controller 9.

Figure 2:
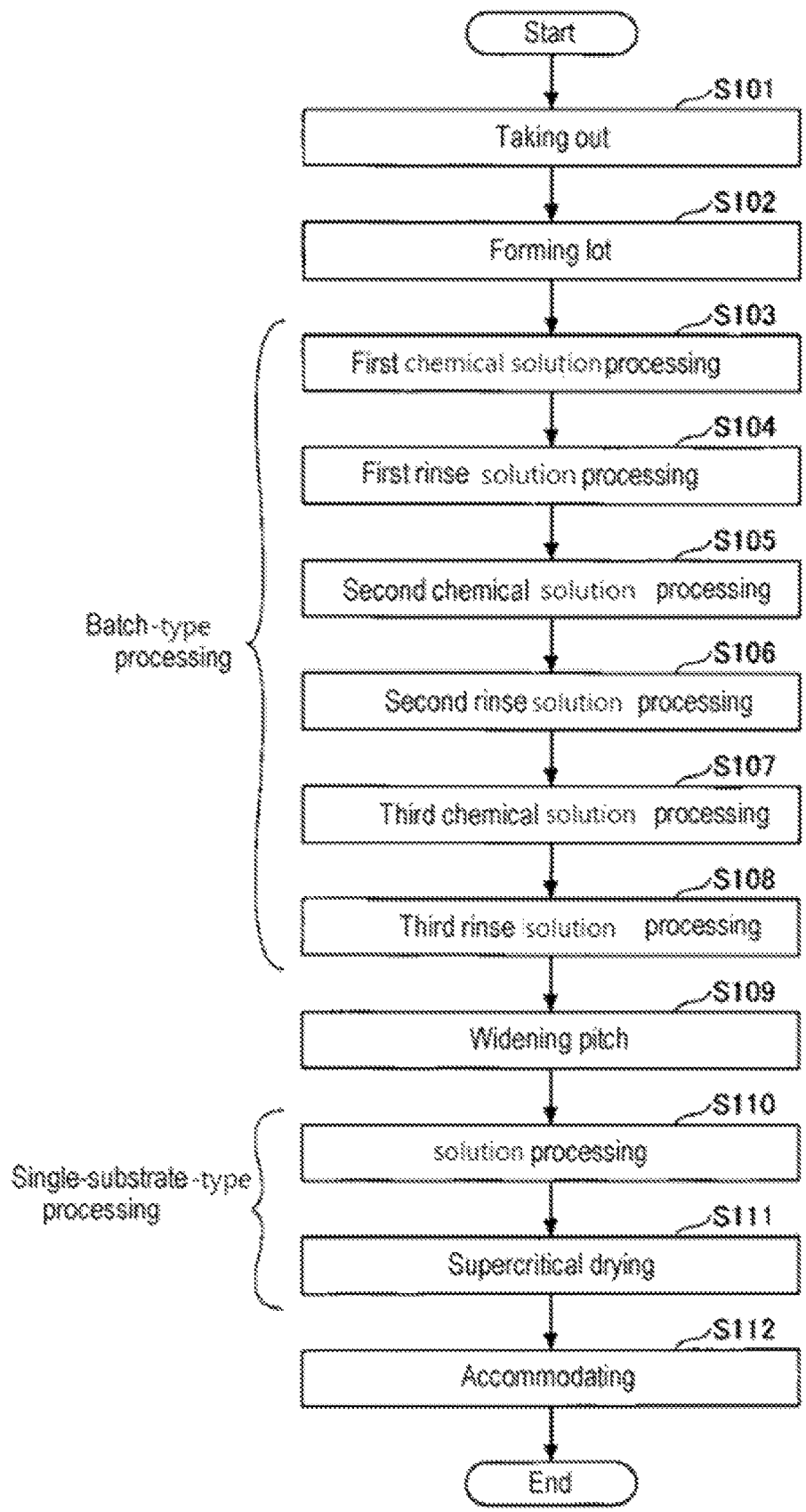
FIG. 2 is a flowchart illustrating a substrate processing method according to an embodiment.

Next, the operation of the substrate processing system 1, that is, a substrate processing method, will be described with reference to FIG. 2. Processes illustrated in FIG. 2 are performed under the control of the controller 9.

First, the cassette C which accommodates the plurality of substrates W is loaded into the loading/unloading part 2 and is placed on the placement board 22. Inside the cassette C, the substrates W are held in a horizontal posture and are held in a vertical direction at the second pitch P2 (P2=N×P1). N is a natural number of 2 or more. N is 2 in the present embodiment, but may be 3 or more.

Subsequently, the first transfer device 24 takes out the substrates W in the cassette C (S101 in FIG. 2), and transfers the same to the first transition device 26. Then, the second transfer device 32 receives the substrates W from the first transition device 26 and transfers the same to the second transition device 33. Then, the first transfer robot 53 receives the substrates W from the second transition device 33 and transfers the same to the lot formation part 51.

Subsequently, the lot formation part 51 holds the plurality of substrates W at the first pitch P1 (P1=P2/N) and forms a lot L (S102 in FIG. 2). A single lot L is composed of, for example, substrates W of N cassettes C. Since the pitch between the substrates W is narrowed from the second pitch P2 to the first pitch P1, it is possible to increase the number of substrates W to be collectively processed.

Subsequently, the third transfer device 62 receives the lot L from the lot formation part 51 and transfers the same to the first processing tool 71. In the transfer course, the third transfer device 62 rotates about the vertical axis to change the arrangement direction of the plurality of substrates W from the X-axis direction to the Y-axis direction.

Subsequently, the first processing tool 71 descends from above the first chemical solution bath 63, and immerses the lot L in the first chemical solution to perform a first chemical solution process (S103 in FIG. 2). Thereafter, the first processing tool 71 ascends to lift up the lot L from the first chemical solution, and then moves in the X-axis direction toward above the first rinse solution bath 64.

Subsequently, the first processing tool 71 descends from above the first rinse solution bath 64, and immerses the lot L in the first rinse solution to perform a first rinse solution process (S104 in FIG. 2). Thereafter, the first processing tool 71 ascends to lift up the lot L from the first rinse solution. Subsequently, the third transfer device 62 receives the lot L from the first processing tool 71 and transfers the same to the second processing tool 73.

Subsequently, the second processing tool 73 descends from above the second chemical solution bath 65, and immerses the lot L in the second chemical solution to perform a second chemical solution process (S105 in FIG. 2). Thereafter, the second processing tool 73 ascends to lift up the lot L from the second chemical solution. Subsequently, the third transfer device 62 receives the lot L from the second processing tool 73 and transfers the same to the third processing tool 75.

Subsequently, the third processing tool 75 descends from above the second rinse solution bath 66, and immerses the lot L in the second rinse solution to perform a second rinse solution process (S106 in FIG. 2). Thereafter, the third processing tool 75 ascends to lift up the lot L from the second rinse solution. Subsequently, the third transfer device 62 receives the lot L from the third processing tool 75 and transfers the same to the first holder 811.

Subsequently, the first holder 811 descends from above the third chemical solution bath 67, and immerses the lot L in the third chemical solution to perform a third chemical solution process (S107 in FIG. 2). Thereafter, the first holder 811 ascends to lift up the lot L from the third chemical solution, and then moves in the X-axis direction toward above the third rinse solution bath 68.

Subsequently, the first holder 811 descends from above the third rinse solution bath 68, and immerses the lot L in the third rinse solution to perform a third rinse solution process (S108 in FIG. 2).

In addition, the first holder 811 delivers some of the lot L to the second holder 814 in the course of descending operation, and widens the pitch between the substrates W from the first pitch P1 to the second pitch P2 (S109 in FIG. 2). The second holder 814 holds plural sheets of substrates W at the second pitch P2, and the first holder 811 also holds plural sheets of substrates W at the second pitch P2. Further, the first holder 811 alternately and repeatedly holds the substrates W to be delivered to the second holder 814 and the substrates W to be continuously held without being delivered to the second holder 814. That is, some substrates W of the lot L and the remaining substrates W of the lot L are alternately and repeatedly arranged to form the lot L.

Subsequently, the second transfer robot 54 transfers the substrates W, which are separately held by the first holder 811 and the second holder 814 in the third rinse solution, to the single-substrate-type processing part 3. Since the pitch between the substrates W is wide, it is possible to prevent interference between the substrates W and the second transfer robot 54. Further, the pitch between the substrates W at the time of forming the lot L can be narrowed, and thus the number of substrates W to be collectively processed can be increased. The second transfer robot 54 transfers the substrates W one by one to the solution processing apparatus 34 of the single-substrate-type processing part 3.

Subsequently, the solution processing apparatus 34 processes the substrates W one by one with solution (S110 in FIG. 2). A plurality of solutions may be used. For example, pure water, such as DIW, or a drying solution having a lower surface tension than the pure water, may be used. The drying solution may be an alcohol such as IPA (isopropyl alcohol). The solution processing apparatus 34 supplies, onto the upper surface of a substrate W, the pure water and the drying solution in this order to form a solution film of the drying solution.

Subsequently, the second transfer device 32 receives the substrates W from the solution processing apparatus 34, and holds the same in a horizontal posture such that the solution film of the drying solution is oriented upward. The second transfer device 32 transfers the substrates W from the solution processing apparatus 34 to the drying apparatus 35.

Subsequently, the drying apparatus 35 dries the substrates W one by one with a supercritical fluid (S111 in FIG. 2). Since the drying solution can be replaced with the supercritical fluid, a concave-convex pattern of each substrate W due to the surface tension of the drying solution can be suppressed from collapsing. Since the supercritical fluid requires a pressure-resistant container, the drying process is performed by the single-substrate-type process, rather than by the batch-type process, from the viewpoint of reducing the size of the pressure-resistant container.

Figure 9:
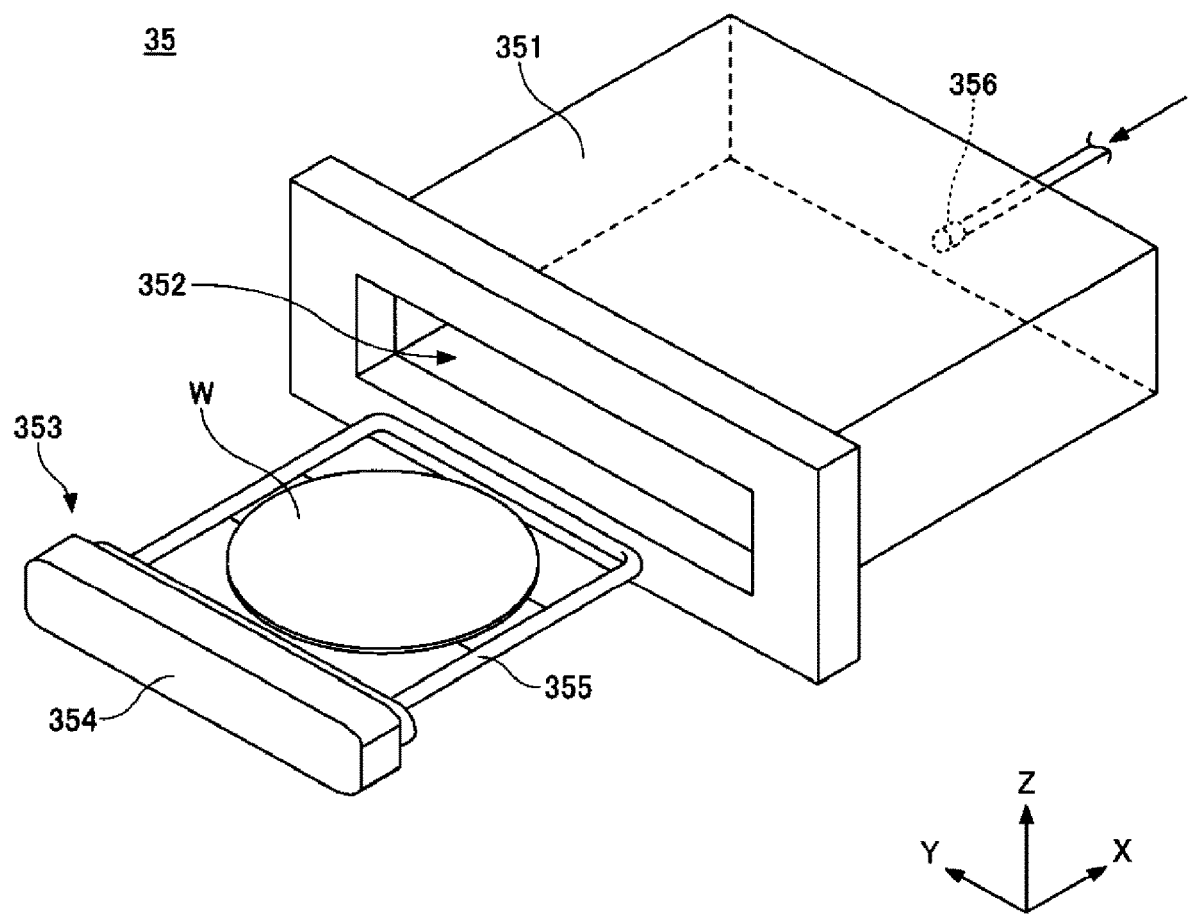
FIG. 9 is a perspective view illustrating an example of a drying apparatus in FIG. 1.

As illustrated in FIG. 9, the drying apparatus 35 includes a pressure-resistant container 351, a movable tray 353, and a supply port 356. The pressure-resistant container 351 has a loading/unloading port 352 for loading/unloading the substrate W therethrough. The movable tray 353 has a lid 354 that opens/closes the loading/unloading port 352, and a holding part 355 that holds the substrate W horizontally. In the state in which the lid 354 closes the loading/unloading port 352, the holding part 355 holds the substrate W horizontally inside the pressure-resistant container 351. A concavo-convex pattern is formed in advance on the upper surface of the substrate W, and the solution film of the drying solution covers the concavo-convex pattern. From the supply port 356, a supercritical fluid such as carbon dioxide is supplied into the pressure-resistant container 351. The number and position of supply ports 356 are not limited to those illustrated in FIG. 9. The drying apparatus 35 dries the substrates W, on each of which the solution film is formed, one by one in a single-substrate-type manner with the supercritical fluid.

The drying apparatus 35 is of a single substrate type in this embodiment, but may be of a batch type as described above. The drying apparatus 35, which is of a batch type, collectively dries the plurality of substrates W each having a solution film formed thereon, with the supercritical fluid. The drying apparatus 35 has a single holding part 355, whereas the drying apparatus 35, which is of a batch type, has a plurality of holding parts 355.

The drying apparatus 35 of this embodiment dries the substrates W with the supercritical fluid, but the drying method is not particularly limited. Any drying method may be used as long as it can suppress collapse of a concavo-convex pattern on a substrate W, and may be, for example, spin drying, scan drying, water-repellent drying, or the like. In the spin drying, as substrate W rotates, the solution film is dropped off from the substrate W by virtue of a centrifugal force. In the scan drying, the substrate W is rotated while shifting the supply position of the drying solution from the center of the substrate W toward the outer periphery of the substrate W, so that the solution film is dropped off from the substrate W by virtue of a centrifugal force. In the scan drying, the supply position of the drying gas, such as a $N_2$ gas, may be shifted from the center of the substrate W toward the outer periphery of the substrate W so as to follow the supply position of the drying solution.

Thereafter, the second transfer device 32 receives the substrate W from the drying apparatus 35 and transfers the same to the first transition device 26.

Subsequently, the first transfer device 24 receives the substrate W from the first transition device 26 and accommodates the same in the cassette C (S112 in FIG. 2). The cassette Cis unloaded from the loading/unloading part 2 in the state of accommodating the plurality of substrates W.

Next, the lot formation part 51 will be described with reference to FIGS. 3, 4A, 4B, and 4C. In figures, the number of substrates W is illustrated to be smaller than the actual number due to a small space in figures. This holds true in the number of first holding grooves 513, the number of second holding grooves 516, and the number of passing grooves 517.

Figure 3:
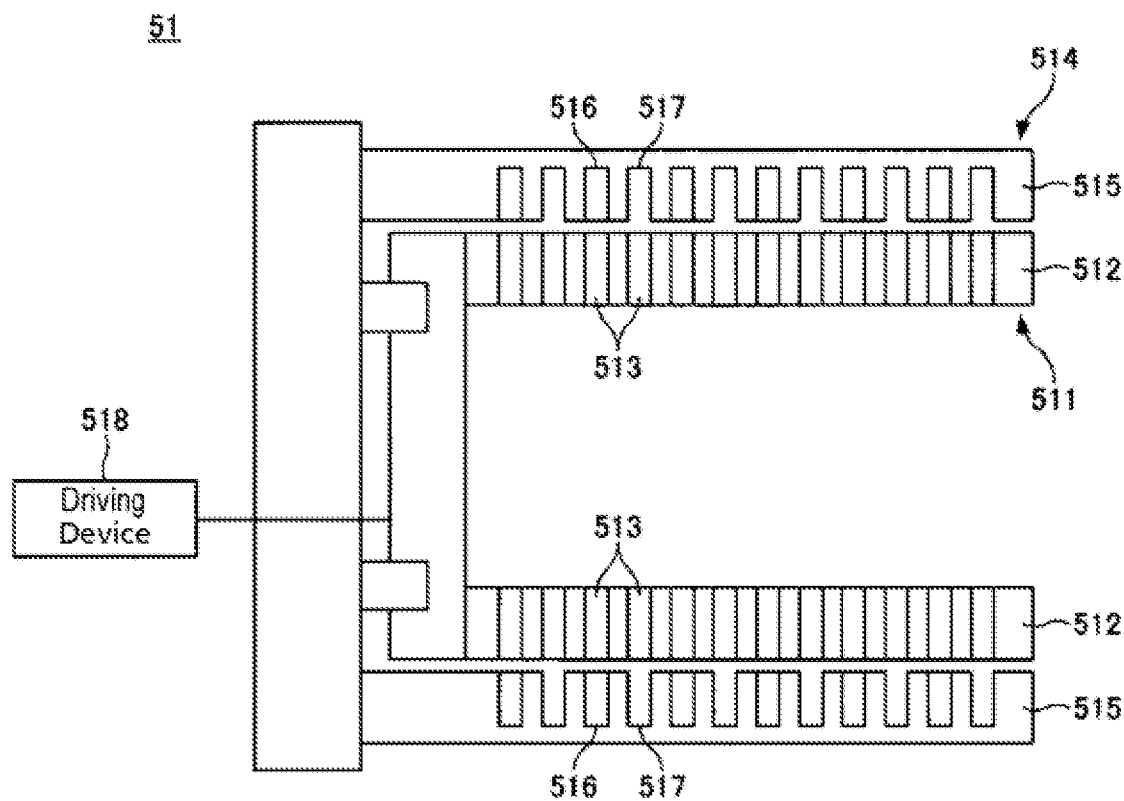
FIG. 3 is a plan view illustrating an example of a lot formation part in FIG. 1.

The lot formation part 51 has a first holder 511. The first holder 511 holds plural sheets (e.g., 50) of substrates W (for example, among 50 sheets of substrates, only 12 sheets of substrates are illustrated in FIG. 4C) at the first pitch P1 in the X-axis direction, and forms a lot L, as illustrated in FIG. 4C. The first holder 511 has a plurality of first arms 512, as illustrated in FIG. 3. The number of first arms 512 is not limited to that illustrated in the figure.

The plurality of first arms 512 each extend in the X-axis direction, and have the first holding grooves 513 arranged at the first pitch P1 in the X-axis direction. The outer peripheries of the substrates W are inserted into the first holding grooves 513, respectively, so that the first holding grooves 513 hold the outer peripheries of the substrates W, respectively. The plurality of first arms 512 hold the respective outer peripheries of the substrates W at intervals in the circumferential direction.

Further, the lot formation part 51 has a second holder 514. The second holder 514 holds plural sheets (e.g., 25) of substrates W (for example, among 25 sheets of substrates, only 6 sheets of substrates are illustrated in FIG. 4B) in the X-axis direction at the second pitch P2, as illustrated in FIG. 4B. The second holder 514 has a plurality of second arms 515, as illustrated in FIG. 3. The number of second arms 515 is not limited to that illustrated in the figure.

The plurality of second arms 515 each extend in the X-axis direction, and have the second holding grooves 516 arranged in the X-axis direction at the second pitch P2. The outer peripheries of the substrates W are inserted into the second holding grooves 516, respectively, so that the second holding grooves 516 hold the outer peripheries of the substrates W, respectively. The plurality of second arms 515 hold the respective outer peripheries of the substrates W at intervals in the circumferential direction.

Further, the plurality of second arms 515 further include the passing grooves 517 arranged in the X-axis direction at the second pitch P2. The outer peripheries of the substrates W are also inserted into the respective passing grooves 517. However, the passing grooves 517 allow the substrates W to pass therethrough without holding the outer peripheries of the substrates W. The passing grooves 517 and the second holding grooves 516 are arranged alternately in the X-axis direction. The passing grooves 517 and the second holding grooves 516 are arranged at the same positions as the plurality of first holding grooves 513 in the X-axis direction, respectively.

Further, the lot formation part 51 has a driving device 518. The driving device 518 moves the first holder 511 up and down with respect to the second holder 514. The first holder 511 ascends and descends between a retreat position below the second holder 514 (see FIG. 4B) and a lot formation position above the second holder 514 (see FIG. 4C).

Next, the operation of the lot formation part 51 will be described with reference to FIGS. 4A, 4B, and 4C again.

Figure 4A:
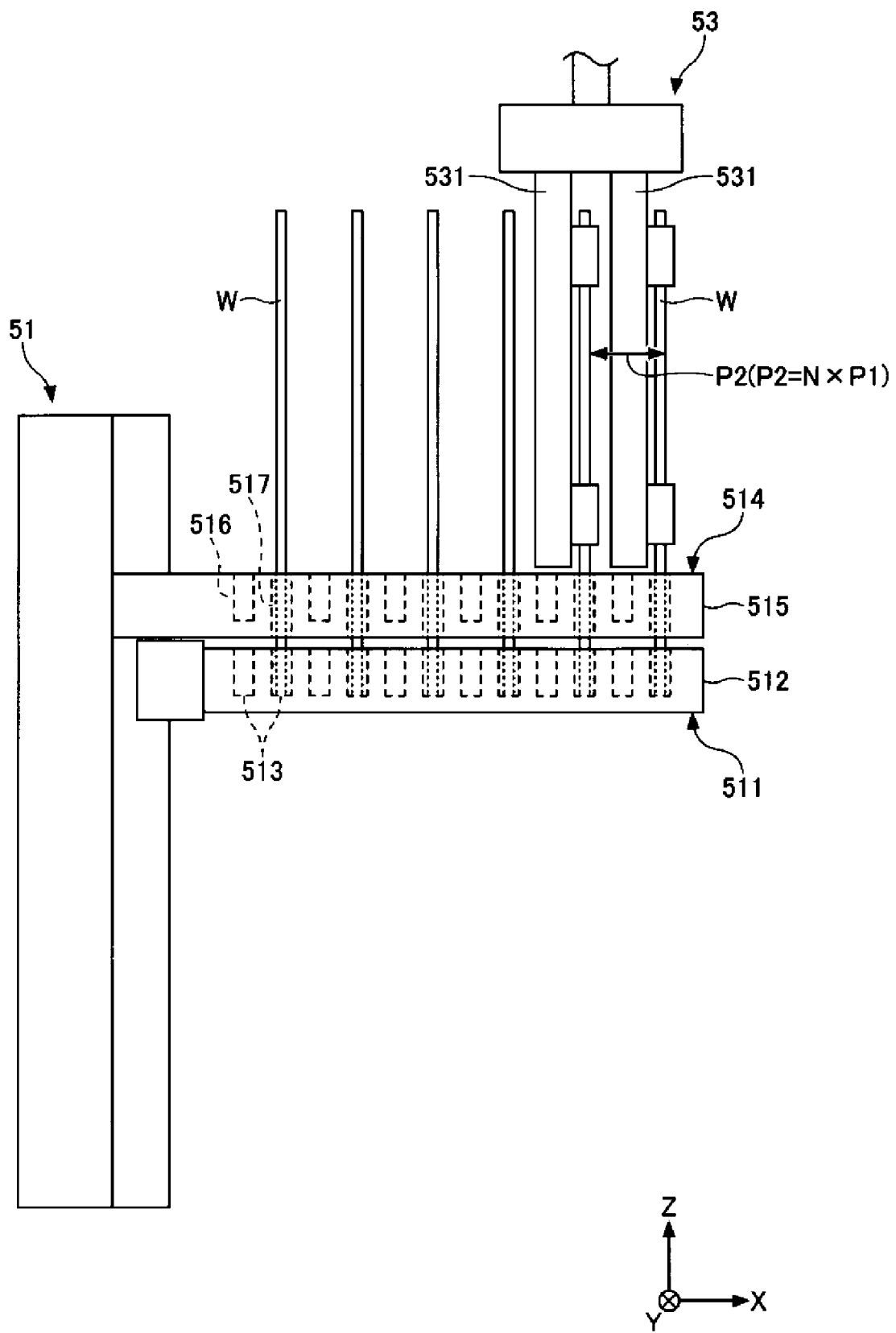
FIG. 4A is a side view illustrating an example of an operation of the lot formation part of FIG. 3.
Figure 4B:
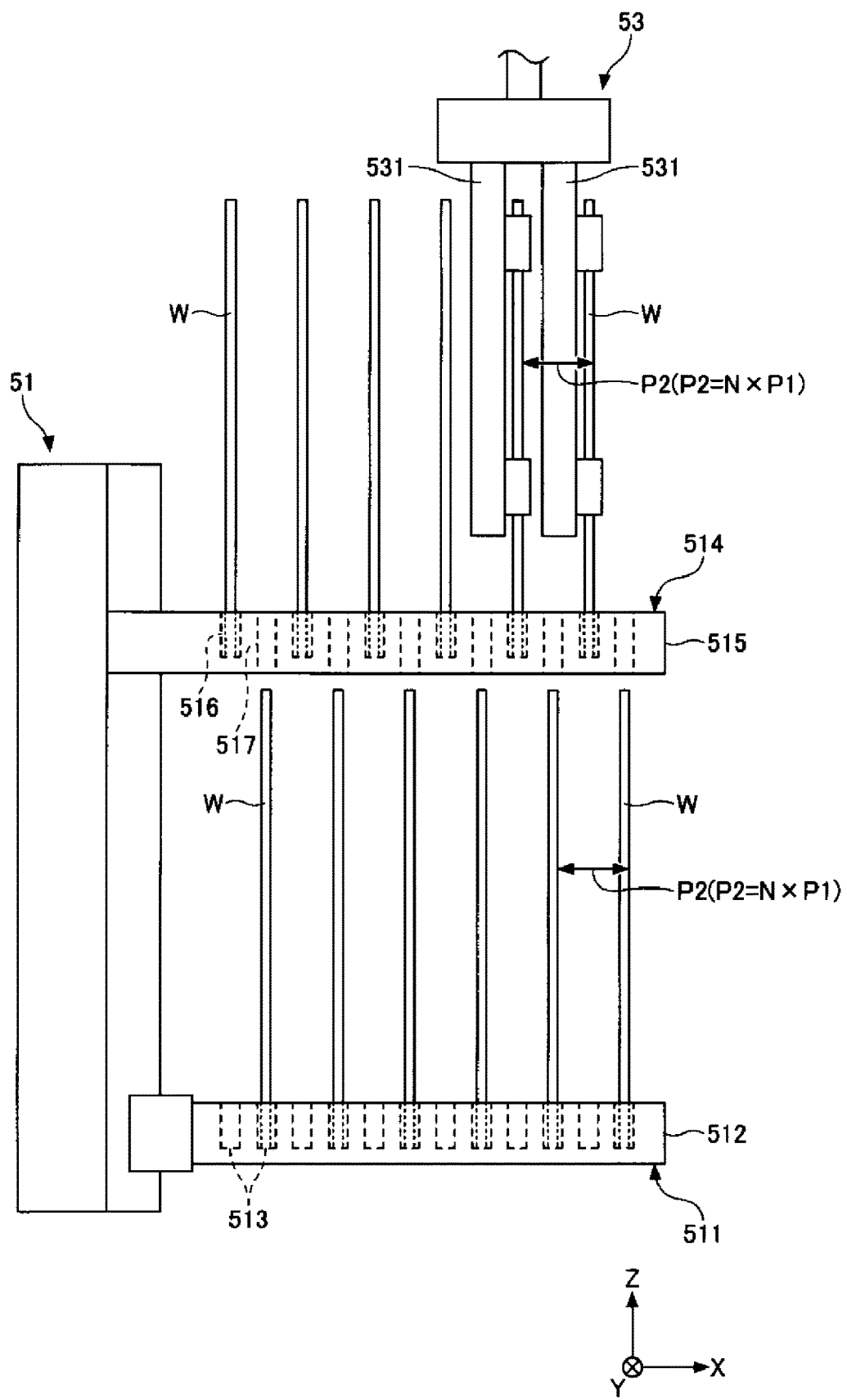
FIG. 4B is a side view illustrating an example of the operation of the lot formation part, which follows FIG. 4A.
Figure 4C:
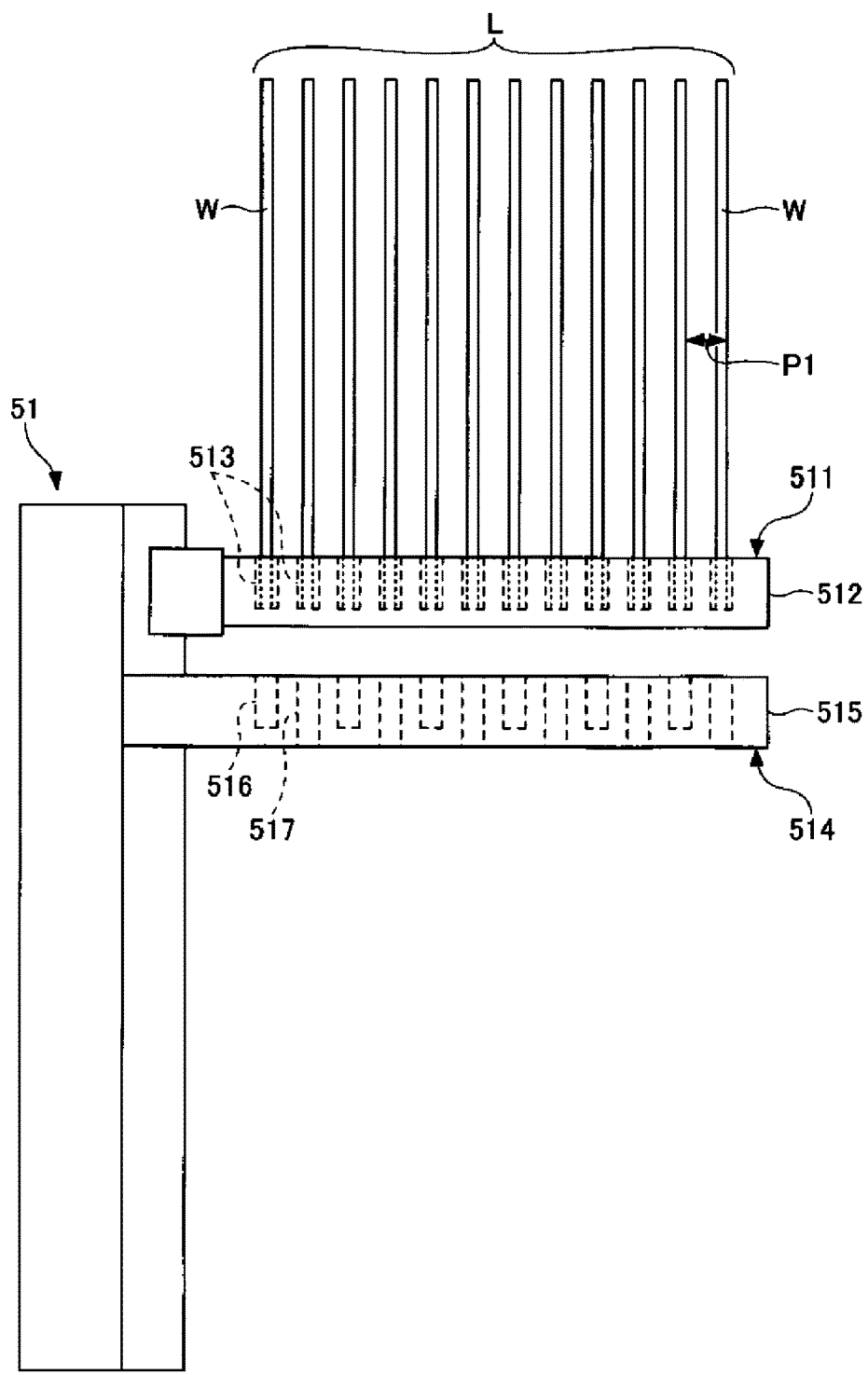
FIG. 4C is a side view illustrating an example of the operation of the lot formation part, which follows FIG. 4B.

First, as illustrated in FIG. 4A, the first holder 511 stops at a reception position below the second holder 514. However, the reception position may be set between the retreat position and the lot formation position, and may be set above the second holder 514. The first transfer robot 53 inserts the substrates W on the basis of plural sheets (for example, 5 sheets; in FIG. 4A, among 5 sheets of substrates, only 2 sheets of substrates are illustrated) into the respective passing grooves 517 of the second holder 514 so as to deliver the substrates W to the first holder 511. This operation is repeated a plurality of times so that the first holder 511 holds plural sheets of substrates W (for example, 25 sheets of substrates; in FIG. 4A, among 25 sheets of substrates, only 6 sheets of substrates are illustrated) at the second pitch P2. The first transfer robot 53 may insert the substrates W one by one into the respective passing grooves 517 of the second holder 514 so as to deliver the substrates W to the first holder 511.

Subsequently, as illustrated in FIG. 4B, the first holder 511 descends from the reception position to the retreat position in order to prevent interference between the substrates W and the first transfer arms 531 of the first transfer robot 53. Thereafter, the first transfer robot 53 inserts the substrates W on the basis of plural sheets (for example, 5 sheets; in FIG. 4B, among 5 sheets of substrates, only 2 sheets of substrates are illustrated) into the respective second holding grooves 516 of the second holder 514 so as to deliver the substrates W to the second holder 514. This operation is repeated a plurality of times so that the second holder 514 holds plural sheets of substrates W (for example, 25 sheets of substrates; in FIG. 4A, among 25 sheets of substrates, only 6 sheets of substrates are illustrated) at the second pitch P2. The first transfer robot 53 may insert the substrates W one by one into the respective second holding grooves 516 of the second holder 514 so as to deliver the substrates W to the second holder 514.

Subsequently, as illustrated in FIG. 4C, the first holder 511 ascends from the retreat position to the lot formation position. In the course of the ascending operation, the first holder 511 receives the substrates W from the second holder 514 into the first holding grooves 513, which remain empty, and combines the currently-received substrates W with the previously-held substrates W to form a lot L.

One lot L is composed of, for example, the substrates W of N cassettes C. However, one lot L may be composed of the substrates W of one cassette C, or may be composed of the substrates W of three or more cassettes C. One lot L may include a plurality of substrates W arranged at the first pitch P1.

The lot formation part 51 may further have a third holder (not illustrated). Similar to the second holder 514, the third holder holds a plurality of substrates W at the second pitch P2 and delivers the same to the first holder 511. Since the first holder 511 receives the substrates W not only from the second holder 514, but also from the third holder, it is possible to increase a ratio N of the first pitch P1 to the second pitch P2, thus increasing the number of substrates W to be collectively processed.

Next, the lot release part 81 will be described with reference to FIGS. 5, 6A, 6B, and 6C. In figures, the number of substrates W is illustrated to be smaller than the actual number due to a small space in figures. This holds true in the number of first holding grooves 813, the number of second holding grooves 816, and the number of passing grooves 817.

Figure 5:
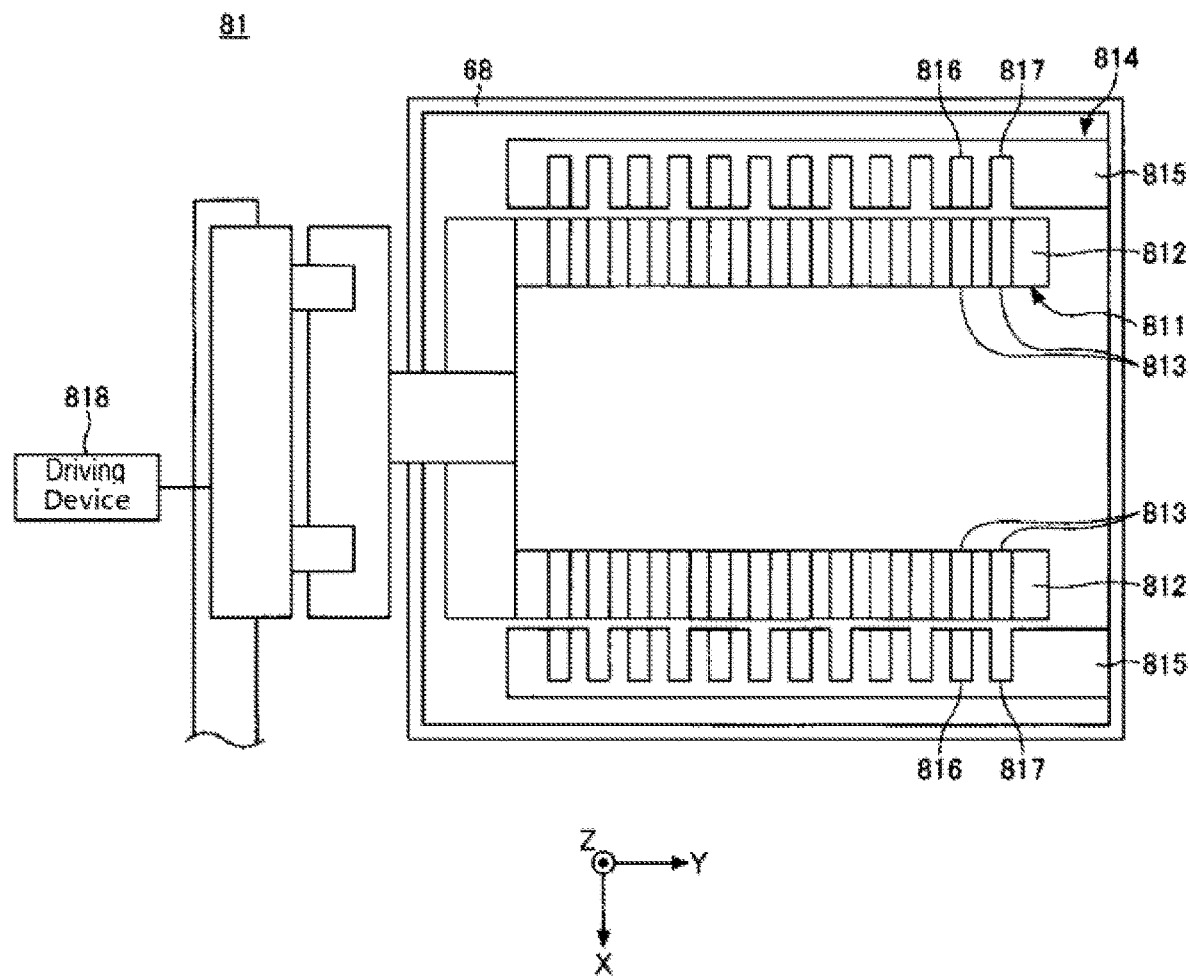
FIG. 5 is a plan view illustrating an example of a lot release part in FIG. 1.
Figure 6A:
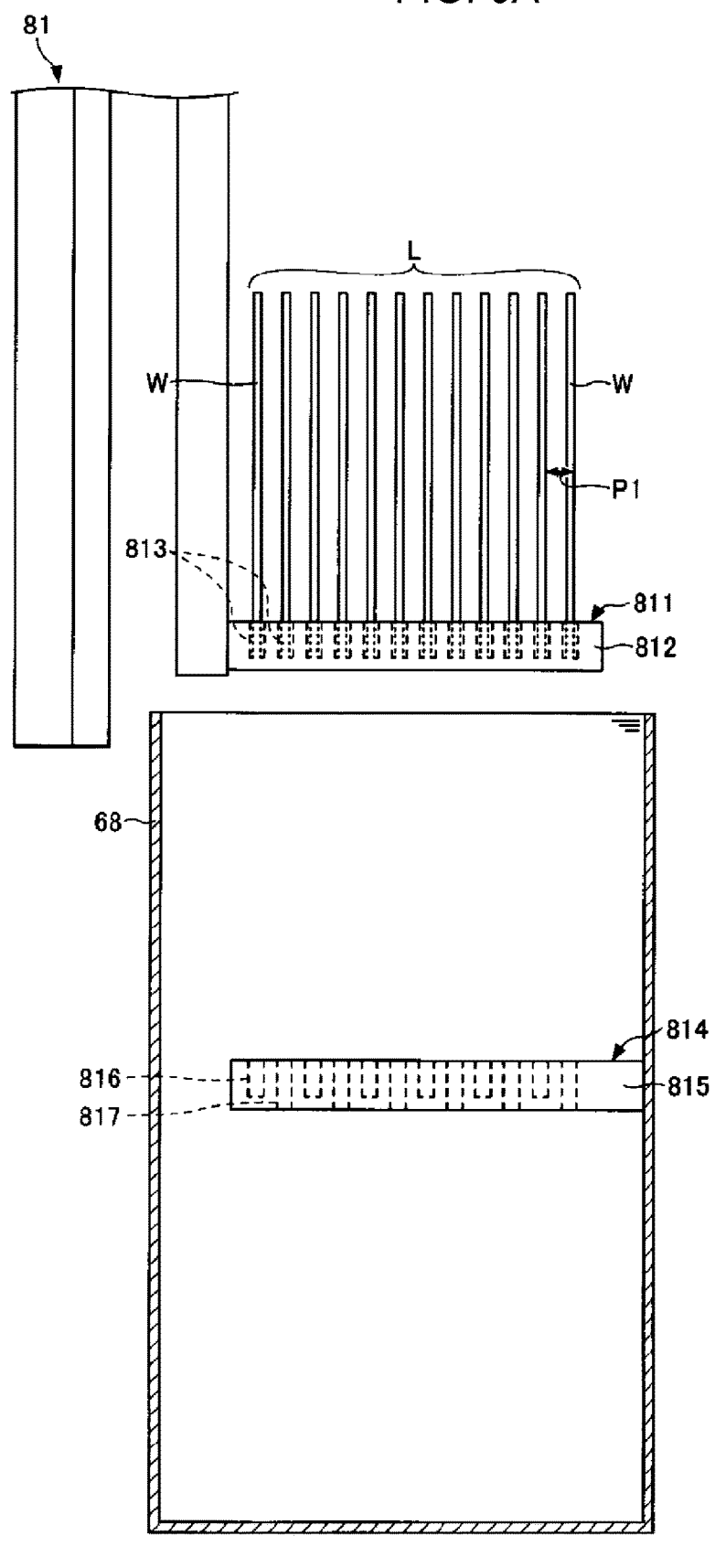
FIG. 6A is a cross-sectional view illustrating an example of operation of the lot release part of FIG. 5.

The lot release part 81 has a first holder 811. The first holder 811 holds plural sheets of substrates W (for example, 50 sheets of substrates; in FIG. 6A, among 50 sheets of substrates, only 12 sheets of substrates are illustrated) in the Y-axis direction at the first pitch P1, as illustrated in FIG. 6A. The first holder 811 has a plurality of first arms 812, as illustrated in FIG. 5. The number of first arms 812 is not limited to that illustrated in the figure.

The plurality of first arms 812 each extend in the Y-axis direction, and have the first holding grooves 813 arranged at the first pitch P1 in the Y-axis direction. The outer peripheries of the substrates W are inserted into the first holding grooves 813, respectively, so that the first holding grooves 813 hold the outer peripheries of the substrates W, respectively. The plurality of first arms 812 hold the respective outer peripheries of the substrates W at intervals in the circumferential direction.

Figure 6B:
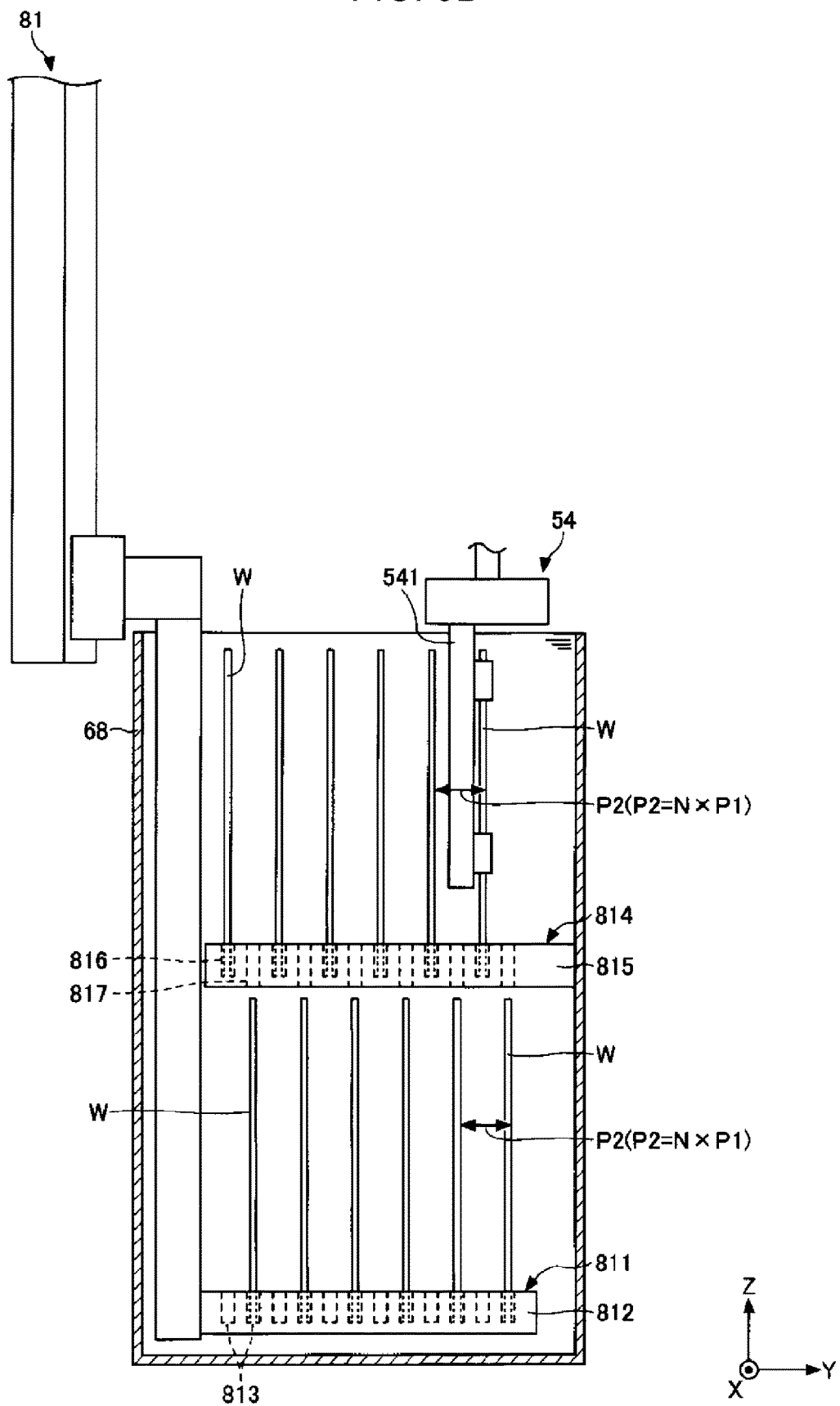
FIG. 6B is a cross-sectional view illustrating an example of an operation of the lot formation part, which follows FIG. 6A.

Further, the lot release part 81 has a second holder 814. The second holder 814 holds plural sheets of substrates W (for example, 25 sheets of substrates; in FIG. 6B, among 25 sheets of substrates, only 6 sheets of substrates are illustrated) in the Y-axis direction at the second pitch P2, as illustrated in FIG. 6B. The second holder 814 has a plurality of second arms 815, as illustrated in FIG. 5. The number of second arms 815 is not limited to that illustrated in the figure.

The plurality of second arms 815 each extend in the Y-axis direction, and have the second holding grooves 816 arranged at the second pitch P2 in the Y-axis direction. The outer peripheries of the substrates W are inserted into the second holding grooves 816, respectively, so that the second holding grooves 816 hold the outer peripheries of the substrates W, respectively. The plurality of second arms 815 hold the respective outer peripheries of the substrates W at intervals in the circumferential direction.

Further, the plurality of second arms 815 further include the passing grooves 817 arranged in the Y-axis direction at the second pitch P2. The outer peripheries of the substrates W are also inserted into the respective passing grooves 817. However, the passing grooves 817 allow the substrates W to pass therethrough without holding the outer peripheries of the substrates W. The passing grooves 817 and the second holding grooves 816 are arranged alternately in the Y-axis direction. The passing grooves 817 and the second holding grooves 816 are arranged at the same positions as the plurality of first holding grooves 813 in the Y-axis direction.

Further, the lot release part 81 has a driving device 818. The driving device 818 moves the first holder 811 up and down with respect to the second holder 814. The first holder 811 ascends and descends between a descent start position above the second holder 814 (see FIG. 6A) and a descent end position below the second holder 814 (see FIG. 6B).

Next, the operation of the lot release part 81 will be described with reference to FIGS. 6A, 6B, and 6C again.

First, as illustrated in FIG. 6A, the first holder 811 holds the plurality of substrates W at the first pitch P1 in the Y-axis direction at the descent start position. The first holder 811 vertically holds each of the plurality of substrates W. The descent start position is set above the third rinse solution bath 68.

Subsequently, as illustrated in FIG. 6B, the first holder 811 descends so as to deliver a portion of the lot L to the second holder 814. The second holder 814 receives the plurality of substrates W arranged at the second pitch P2 from the first holder 811 in the third rinse solution. The first holder 811 holds the plurality of substrates W that have passed through the passing grooves 817 of the second holder 814 at the second pitch P2 at the descent end position.

As a result, the plurality of substrates W are separately held in the third rinse solution by the first holder 811 and the second holder 814. The second holder 814 holds the plurality of substrates W at the second pitch P2 above the first holder 811. Likewise, the first holder 811 holds the plurality of substrates W at the second pitch P2. Each of the substrates W is held vertically.

Subsequently, as illustrated in FIG. 6B, the second transfer robot 54 receives the substrates W from the second holder 814, lifts up the substrates W one by one from the third rinse solution, and transfers the substrates W to the single-substrate-type processing part 3. Since the substrates W are held at the second pitch P2, it is possible to prevent interference between the substrates W and the second transfer arm 541 of the second transfer robot 54. The second transfer robot 54 may lift up the substrates W on the basis of plural sheets from the third rinse solution. The lifting is repeated until all the substrates W are removed from the second holder 814.

Figure 6C:
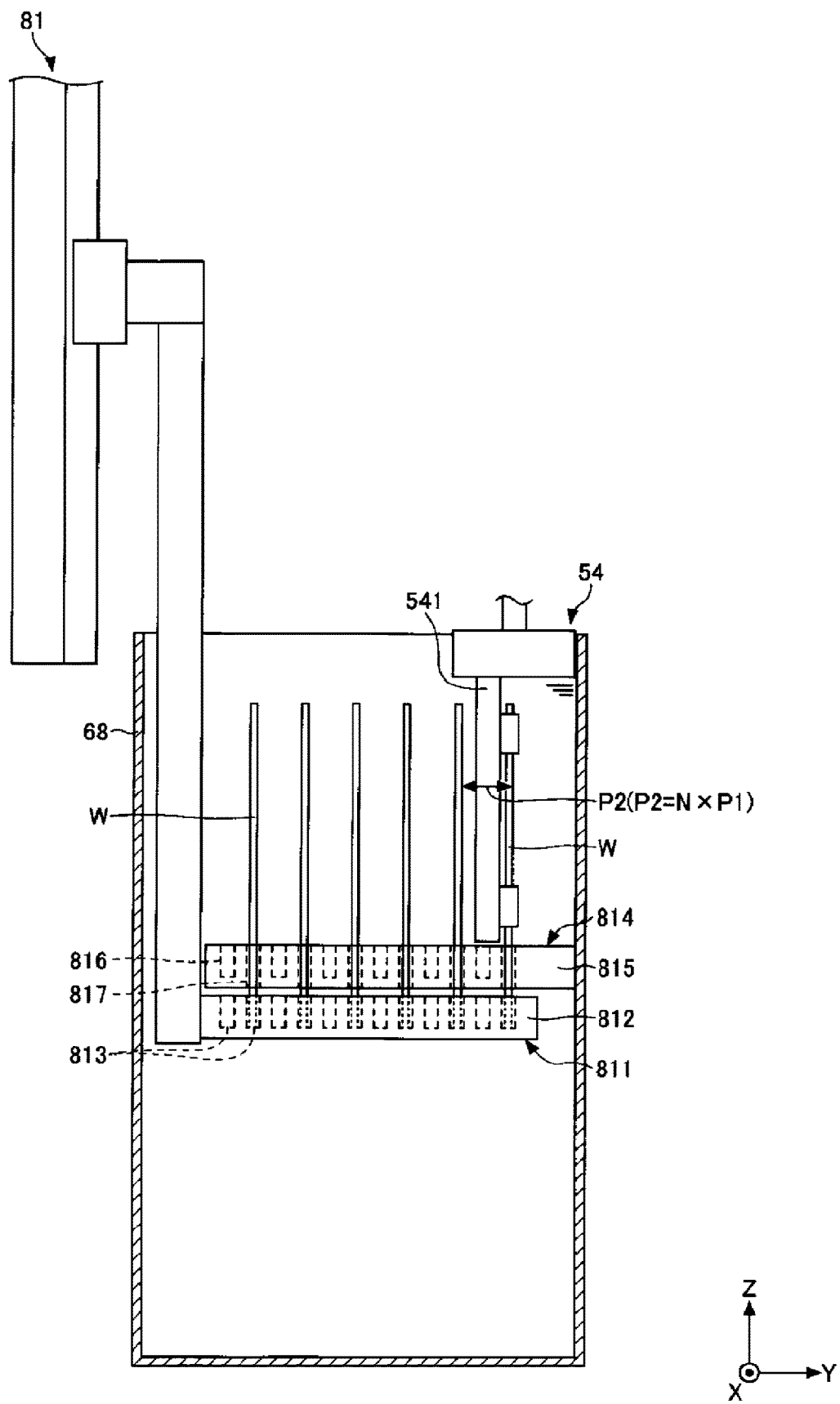
FIG. 6C is a cross-sectional view illustrating an example of the operation of the lot formation part, which follows FIG. 6B.

Next, as illustrated in FIG. 6C, the first holder 811 ascends so as to deliver the substrates W to the second transfer robot 54. The first holder 811 stops at a position slightly lower than the second holder 814, but may stop at a position higher than the second holder 814. The substrates W may be kept immersed in the third rinse solution.

Subsequently, as illustrated in FIG. 6C, the second transfer robot 54 receives the substrates W from the first holder 811, lifts up the substrates W one by one from the third rinse solution, and transfers the substrates W to the single-substrate-type processing part 3. Since the substrates W are held at the second pitch P2, it is possible to prevent interference between the substrates W and the second transfer arm 541 of the second transfer robot 54. The second transfer robot 54 may lift up the substrates W on the basis of plural sheets from the third rinse solution. The lifting is repeated until all the substrates W are removed from the first holder 811.

As described above, the substrates W are held in the third rinse solution until being lifted up from the third rinse solution by the second transfer robot 54. Since the substrates W exist below the solution surface of the third rinse solution, the surface tension of the third rinse solution does not act on the substrates W, which makes it is possible to prevent the collapse of the convex-concave patterns on the substrates W.

The lot release part 81 may further include a third holder (not illustrated). Similar to the second holder 814, the third holder receives the plurality of substrates W arranged at the second pitch P2 from the first holder 811 in the third rinse solution. Since the first holder 811 delivers the substrates W not only to the second holder 814, but also to the third holder 814, it is possible to increase a ratio N of the first pitch P1 to the second pitch P2.

The lot release part 81 is installed in the third rinse solution bath 68 to reduce the size of the batch-type processing part 6, but may be installed in a dedicated processing bath. The processing bath may store pure water, like the third rinse solution bath 68. When the pure water is used, it is possible to suppress deterioration of the second transfer arm 541 of the second transfer robot 54. The lot release part 81 may be installed in the chemical solution bath as long as the deterioration of the second transfer arm 541 can be suppressed.

Next, the first transfer robot 53 and the second transfer robot 54 will be described with reference to FIG. 7. The number of first transfer arms 531 of the first transfer robot 53 is illustrated to be smaller than the actual number due to a small space in figure.

The first transfer robot 53 transfers the substrates W from the single-substrate-type processing part 3 to the lot formation part 51 of the interface part 5. The substrates W are made into one lot L by the lot formation part 51 and subsequently, are transferred from the lot formation part 51 to the batch-type processing part 6.

The first transfer robot 53 is, for example, a 6-axis robot, and has six rotational axes R1, R2, R3, R4, R5, and R6. The first transfer robot 53 may be a 7-axis robot. The first transfer robot 53 may not be an articulated robot, but may be an orthogonal robot. The orthogonal robots may have a rotational axis.

The first transfer robot 53 has a first transfer arm 531 at the leading end thereof. The first transfer arm 531 holds the substrate W. The thickness of the first transfer arm 531 is set to such a level such that the first transfer arm 531 can be inserted between the substrates W arranged at the second pitch P2. A plurality of first transfer arms 531 may be provided such that plural sheets (e.g., 5) of substrates W (among five sheets of substrates, only two sheets of substrates are illustrated in FIG. 7) can be collectively transferred.

The second transfer robot 54 transfers the substrates W from the batch-type processing part 6 to the single-substrate-type processing part 3. The second transfer robot 54 transfers the substrates W from the third rinse solution bath 68 to the solution processing apparatus 34. In transferring the substrates W from the third rinse solution bath 68 to the solution processing apparatus 34, the second transfer robot 54 is used, and the second transfer device 32 is not used. Accordingly, it is possible to prevent the second transfer device 32 from getting wet with the third rinse solution. In addition, a transfer origin may be appropriately selected depending on the configuration of the batch-type processing part 6. Likewise, a transfer destination may be appropriately selected depending on the configuration of the single-substrate-type processing part 3.

The second transfer robot 54 is configured similarly to the first transfer robot 53, and has a second transfer arm 541 at the leading end thereof. The second transfer arm 541 holds the substrate W. The thickness of the second transfer arm 541 is set to such a level such that the second transfer arm 541 can be inserted between the substrates W arranged at the second pitch P2. A single second transfer arm 541 is provided to transfer the substrates W one by one, but a plurality of second transfer arms 541 may be provided to transfer a plurality of substrates W in a collective manner.

Since the second transfer arm 541 lifts up the substrate W from the third rinse solution, the second transfer arm 541 may get wet with the third rinse solution. In order to prevent the third rinse solution from being dripped from the second transfer arm 541 to the wrist thereof, the second transfer robot 54 may be suspended from a ceiling 55 of the interface part 5. Meanwhile, the first transfer robot 53 is installed on the floor 56 of the interface part 5.

The arrangement of the second transfer robot 54 and the first transfer robot 53 may be reversed. The first transfer robot 53 may be suspended from the ceiling 55, and the second transfer robot 54 may be installed on a floor 56. In this case, it is possible to prevent the third rinse solution adhering to the second transfer arm 541 from dripping onto the first transfer robot 53. The first transfer robot 53 is capable of always transferring the substrates W in a dried state.

In some embodiments, both the first transfer robot 53 and the second transfer robot 54 may be suspended from the ceiling 55, or both may be installed on the floor 56. In addition, one or more of the first transfer robot 53 and the second transfer robot 54 may be installed on the sidewall. The sidewall is positioned between the ceiling 55 and the floor 56, and is disposed vertically unlike the ceiling 55 and the floor 56. The ceiling 55 and the floor 56 are disposed horizontally.

While the substrate W is being transferred by the second transfer arm 541, high humidity gas may be supplied to the substrate W for the purpose of preventing the substrate W from drying. The second transfer robot 54 may be provided with a gas nozzle that blows off droplets adhering to the second transfer arm 541. In addition, the second transfer robot 54 may be provided with a drain pan that collects droplets dripping from the second transfer arm 541 toward the wrist. The droplets are condensed third rinse solution or condensed high-humidity gas.

Next, a substrate processing system 1A of a first modification will be described with reference to FIG. 10. Hereinafter, differences between this modification and the embodiment described above will be mainly described.

Figure 10:
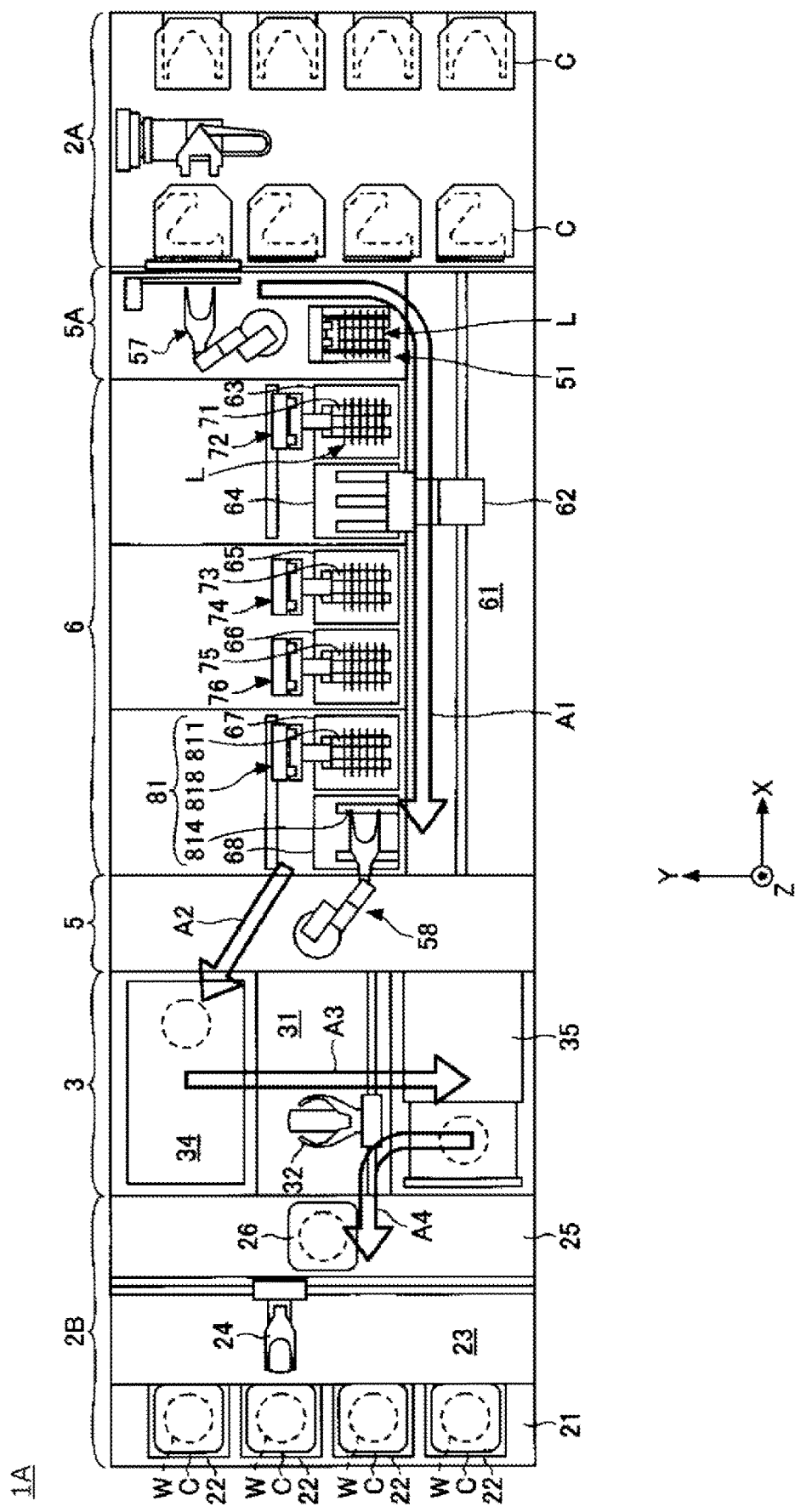
FIG. 10 is a plan view illustrating a substrate processing system of a first modification.

In the substrate processing system 1A of this modification, as illustrated in FIG. 10, a loading part 2A and an unloading part 2B are provided separately. A cassette C is loaded into the loading part 2A in the state in which a plurality of substrates W are accommodated in the cassette C at a second pitch P2. In addition, the cassette C is unloaded from the unloading part 2B in the state in which the plurality of substrates W are accommodated in the cassette C at the second pitch P2.

Further, the substrate processing system 1A of this modification has an additional interface part 5A in addition to the interface part 5. The additional interface part 5A delivers the substrates W between the loading part 2A and the batch-type processing part 6. The additional interface part 5A has a lot formation part 51 and a transfer robot 57.

The transfer robot 57 is configured similarly to the first transfer robot 53 illustrated in FIG. 7, and transfers the substrates W from the loading part 2A to the lot formation part 51. The transfer robot 57 may collectively transfer all the substrates W accommodated in one cassette C, and may collectively transfer, for example, 25 sheets of substrates W.

The interface part 5 of this modification has a transfer robot 58 corresponding to the second transfer robot 54 illustrated in FIG. 7. The transfer robot 58 transfers the substrates W from the batch-type processing part 6 to the single-substrate-type processing part 3. The interface part 5 does not have the function of the first transfer robot 53 illustrated in FIG. 7. In the interface part 5, the substrates W travel in one direction.

The additional interface part 5A, the batch-type processing part 6, the interface part 5, and the single-substrate-type processing part 3 are arranged in this order between the loading part 2A and the unloading part 2B along the transfer direction of the substrates W. The substrates W are transferred from the loading part 2A in the order of arrows A1, A2, A3, and A4 indicated in FIG. 10, and are then transferred to the unloading part 2B.

According to this modification, since the substrates W travel in one direction in the interface part 5 and the additional interface part 5A, it is possible to prevent the travel of the substrates W from stagnating and thus to improve throughput.

The lot formation part 51 of this modification is arranged near the long side of the third transfer region 61 of the batch-type processing part 6, like the processing baths such as the third rinse solution bath 68. Specifically, the lot formation part 51, the first chemical solution bath 63, the first rinse solution bath 64, the second chemical solution bath 65, the second rinse solution bath 66, the third chemical solution bath 67, and the third rinse solution bath 68 are arranged in a row in this order.

As described above, the lot formation part 51 is arranged near the long side of the third transfer region 61 of the batch-type processing part 6, like the processing baths such as the third rinse solution bath 68. Accordingly, the arrangement direction of the substrates W in the lot formation part 51 and the arrangement direction of the substrates W in the processing bath are the same. Therefore, it is not necessary for the third transfer device 62 to rotate about the vertical axis. Thus, a respective rotation shaft is not needed, which makes it is possible to simplify the structure of the third transfer device 62.

Next, a substrate processing system 1B according to a second modification will be described with reference to FIG. 11. Hereinafter, differences between the second modification and the first modification disclosed above will be mainly described. In the first modification, the loading part 2A, the additional interface part 5A, the batch-type processing part 6, the interface part 5, the single-substrate-type processing part 3, and the unloading part 2B are arranged in a row in this order.

In the second modification, the loading part 2A, the additional interface part 5A, the batch-type processing part 6, the interface part 5, the single-substrate-type processing part 3, and the unloading part 2B are arranged in a U-shape in this order. Specifically, the loading part 2A, the additional interface part 5A, and the batch-type processing part 6 are arranged in a row along the X-axis direction, the unloading part 2B and the single-substrate-type processing part 3 are arranged in a row along the X-axis direction, and the interface part 5 extends from the batch-type processing part 6 to the single-substrate-type processing part 3 in the Y-axis direction.

The interface part 5 has a transfer robot 58 corresponding to the second transfer robot 54 illustrated in FIG. 7, a transition device 591, a transfer region 592, and a transition device 593. The transfer robot 58, the transition device 591, the transfer region 592, and the transition device 593 are arranged in a row along the Y-axis direction in this order.

A transfer device 594 is provided in the transfer region 592. The transfer device 594 has a transfer arm. The transfer arm is movable in the horizontal direction (the X-axis direction and the Y-axis direction) and the vertical direction, and is rotatable around the vertical axis. The transfer arm transfers the substrate W from the transition device 591 to the transition device 593 separately provided. The number of transfer arms may be one or more. In the latter case, the transfer device 594 collectively transfers plural sheets (e.g., 5) of substrates W.

Next, the operation of the interface part 5 of this modification will be described. First, the transfer robot 58 lifts up the substrates W from the third rinse solution and transfers the same to the transition device 591. Subsequently, the transfer device 594 transfers the substrates W from the transition device 591 to the separately-provided transition device 593. Thereafter, the second transfer device 32 of the single-substrate-type processing part 3 receives the substrates W from the transition device 593 and transfers the same to the solution processing apparatus 34.

Figure 11:
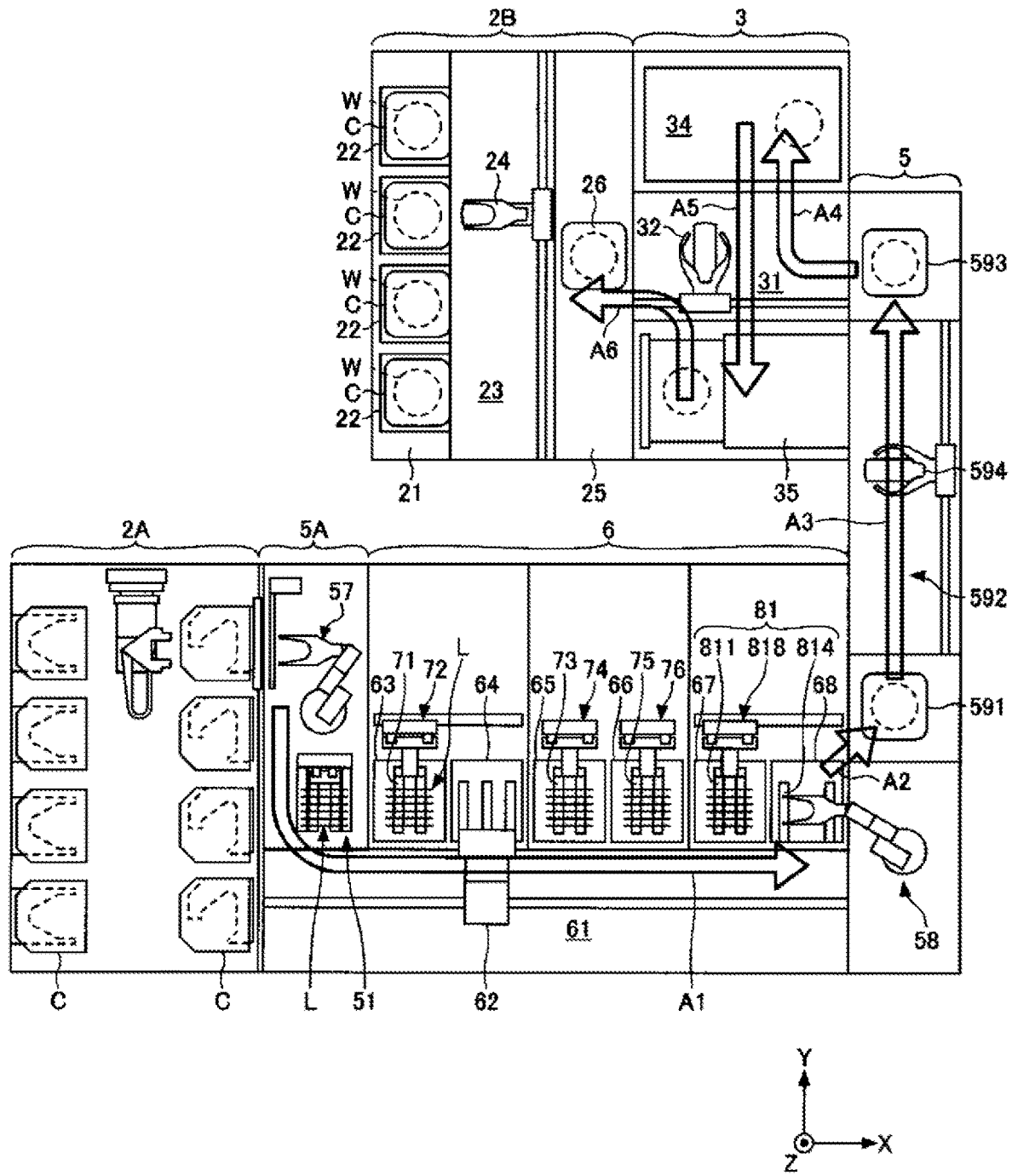
FIG. 11 is a plan view illustrating a substrate processing system of a second modification.

The substrates W are transferred from the loading part 2A in the order of arrows A1, A2, A3, A4, A5, and A6 indicated in FIG. 11, and are then transferred to the unloading part 2B.

For example, in the embodiments and modifications described above, the cassette C accommodates the substrates W at the second pitch P2. However, the cassette C may accommodate the substrates W at a pitch other than the second pitch P2. As an example, the cassette C may accommodate the substrates at a pitch narrower than the second pitch P2 (e.g., at the first pitch P1), or at a pitch wider than the second pitch P2. As the lot release part 81 widens the pitch between the substrates W from the first pitch P1 to the second pitch P2, it is possible to suppress the interference between the substrates W and the transfer robots 54 and 58.

In the embodiments and modifications described above, the lot formation part 51 narrows the pitch between the substrates W during the formation of the lot L, but may not narrow the pitch. For example, in a case in which the number of substrates W accommodated in the cassette C is smaller than the maximum number that can be accommodated by the cassette C, the lot formation part 51 may not narrow the pitch between the substrates W. In any case, as the lot release part 81 widens the pitch between the substrates W from the first pitch P1 to the second pitch P2, it is possible to suppress the interference between the substrates W and the transfer robots 54 and 58.

In the embodiments and modifications described above, the lot release part 81 widens the pitch between the substrates W from the first pitch P1 to the second pitch P2 in the processing solution having a lump shape, which is larger than the size of the substrate W. In some embodiments, the lot release part 81 may widen the pitch between the substrates W from the first pitch P1 to the second pitch P2 in a processing solution having a mist shape. Even if the processing solution remains in a mist state, the drying of the substrates W can be prevented. Thus, it is possible to suppress the collapse of the convex-concave pattern on the substrate W.

In the embodiments and modifications described above, as illustrated in FIG. 7, the transfer part 52 includes the first transfer robot 53 and the second transfer robot 54. In some embodiments, as illustrated in FIG. 8, the transfer part 52 may include a single transfer robot 41. The transfer robot 41 serves as both the first transfer robot 53 and the second transfer robot 54.

The transfer robot 41 has the first transfer arm 531 of the first transfer robot 53 and the second transfer arm 541 of the second transfer robot 54. Each of the first transfer arm 531 and the second transfer arm 541 is attached to the leading end of the transfer robot 41. The transfer robot 41 transfers the substrates W from the single-substrate-type processing part 3 to the lot formation part 51 using the first transfer arm 531, and transfers the substrates W from the batch-type processing part 6 to the single-substrate-type processing part 3 using the second transfer arm 541.

As illustrated in FIG. 8, the transfer robot 41 further includes a moving mechanism 411 configured to move the second transfer arm 541 relative to the first transfer arm 531 in order to operate the first transfer arm 531 and the second transfer arm 541 independently of each other. The moving mechanism 411 is provided, for example, at the leading end of the transfer robot 41. Although the moving mechanism 411 moves the second transfer arm 541 relative to the leading end of the transfer robot 41 in FIG. 8, the moving mechanism 411 may move the first transfer arm 531 relative to the leading end of the transfer robot 41.

As illustrated in FIG. 8, the transfer robot 41 may be suspended from the ceiling 55, but may be installed on the floor 56 or the sidewall.

According to an aspect of the present disclosure, it is possible to narrow a pitch between a plurality of substrates which is to be processed in a batch manner, and to suppress interference between the substrates and a transfer robot.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing system comprising:
a loading part into which a cassette configured to accommodate a plurality of substrates is loaded;
a batch-type processing part configured to collectively process a lot including the plurality of substrates;
a single-substrate-type processing part configured to process the plurality of substrates of the lot one by one;
an unloading part from which the cassette configured to accommodate the plurality of substrates is unloaded;
an interface part configured to deliver the plurality of substrates between the batch-type processing part and the single-substrate-type processing part; and
an additional interface part configured to deliver the plurality of substrates between the loading part and the batch-type processing part and including a lot formation part configured to form the lot,
wherein the loading part and the unloading part are provided separately, and the additional interface part, the batch-type processing part, the interface part, and the single-substrate-type processing part are arranged between the loading part and the unloading part in this order in a transfer direction of the plurality of substrates and opposite sides of the transfer direction, and
wherein a transfer device in the batch-type processing part moves only in the transfer direction to deliver the plurality of substrates from the batch-type processing part to the interface part.

2. The substrate processing system of claim 1, wherein the interface part includes a transfer part configured to transfer the plurality of substrates from the batch-type processing part to the single-substrate-type processing part.

3. The substrate processing system of claim 2, wherein the batch-type processing part includes a processing bath that stores a processing solution having a lump shape or a mist shape in which the lot is immersed; and
    wherein the transfer part is configured to transfer the plurality of substrates held in the processing solution from the processing bath of the batch-type processing part to the single-substrate-type processing part.

4. The substrate processing system of claim 3, wherein the processing bath is configured to store pure water in which the lot is immersed.

5. The substrate processing system of claim 1, wherein the single-substrate-type processing part comprises a solution processing apparatus configured to process the plurality of substrates one by one with a solution.

6. The substrate processing system of claim 1, wherein the single-substrate-type processing part comprises a drying apparatus configured to dry the plurality of substrates one by one with a supercritical fluid.

7. A substrate processing method using the substrate processing system of claim 1, the substrate processing method comprising:
    transferring the plurality of substrates between the loading part and the unloading part in an order of the additional interface part, the batch-type processing part, the interface part, and the single-substrate-type processing.

\* \* \* \* \*